US012167536B2

(12) United States Patent
Ishimatsu et al.

(10) Patent No.: US 12,167,536 B2
(45) Date of Patent: Dec. 10, 2024

(54) ELECTRONIC DEVICE

(71) Applicant: ROHM CO., LTD., Kyoto (JP)

(72) Inventors: Yuji Ishimatsu, Kyoto (JP); Kenji Hama, Kyoto (JP); Hideo Hara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 205 days.

(21) Appl. No.: 17/800,825

(22) PCT Filed: Feb. 15, 2021

(86) PCT No.: PCT/JP2021/005493
§ 371 (c)(1),
(2) Date: Aug. 18, 2022

(87) PCT Pub. No.: WO2021/182022
PCT Pub. Date: Sep. 16, 2021

(65) Prior Publication Data
US 2023/0083231 A1 Mar. 16, 2023

(30) Foreign Application Priority Data
Mar. 10, 2020 (JP) .................................. 2020-040873

(51) Int. Cl.
H05K 1/14 (2006.01)
H05K 1/02 (2006.01)

(52) U.S. Cl.
CPC ............. H05K 1/14 (2013.01); H05K 1/0203 (2013.01)

(58) Field of Classification Search
CPC ......... H01L 2924/19105; H01L 23/367; H01L 23/49555; H01L 23/49575;
(Continued)

(56) References Cited

U.S. PATENT DOCUMENTS 4,621,304 A * 11/1986 Oogaki .............. H05K 7/20436
257/E23.09
5,057,906 A * 10/1991 Ishigami ............. H01L 23/4334
257/E23.092

(Continued)

FOREIGN PATENT DOCUMENTS

JP   2007-188934 A   7/2007
JP   2014-90006 A    5/2014

(Continued)

OTHER PUBLICATIONS

Office Action received in the corresponding German Patent application, Jan. 22, 2024, and machine translation (10 pages).

(Continued)

Primary Examiner — Michael A Matey
(74) Attorney, Agent, or Firm — HSML P.C.

(57) ABSTRACT

An electronic device includes a first electronic component including a first main body, a second electronic component including a second main body, a mounting substrate having a mounting surface, and a heat dissipator having an attaching surface. The mounting surface and the attaching surface face each other in the z direction. The first main body and the second main body are disposed between the mounting substrate and the heat dissipator in the z direction and arranged side by side in the x direction. The first main body has a first front surface facing the attaching surface and a first back surface facing the mounting surface. The second main body has a second front surface facing the attaching surface and a second back surface facing the mounting surface. The dimension of the second main body in the z direction is smaller than the dimension of the first main body in the z direction. The first front surface and the second front surface overlap with each other as viewed in the x direction.

(Continued)

A gap is provided between the second back surface and the mounting surface.

15 Claims, 14 Drawing Sheets

(58) Field of Classification Search
CPC . H01L 2224/48137; H01L 2224/48227; H01L 2224/73265; H01L 23/36; H01L 24/45; H01L 24/48; H01L 24/49; H01L 2924/15313; H01L 21/4882; H01L 2224/0603; H01L 2224/06181; H01L 23/49531; H01L 23/49811; H01L 25/072; H01L 2924/19106; H01L 23/49513; H01L 23/49827; H01L 25/0655; H01L 2924/13055; H01L 2924/13091; H01L 2023/4031; H01L 2023/405; H01L 21/4853; H05K 1/0209; H05K 2201/0715; H05K 2201/10522; H05K 9/0022; H05K 2201/10977; H05K 1/14; H05K 1/0203
See application file for complete search history.

(56) References Cited

U.S. PATENT DOCUMENTS

| | | | | |
|---|---|---|---|---|
| 5,747,876 | A * | 5/1998 | Majumdar | H01L 25/165 361/716 |
| 9,642,277 | B2 * | 5/2017 | Blumenthal | E05B 85/02 |
| 2002/0139467 | A1 * | 10/2002 | Tomioka | H05K 1/141 156/92 |
| 2003/0034381 | A1 * | 2/2003 | Nakatsuka | B23K 1/085 228/180.1 |
| 2004/0160754 | A1 * | 8/2004 | Kobayashi | H05K 7/20854 361/783 |
| 2011/0189870 | A1 * | 8/2011 | Ito | H01R 12/716 439/78 |
| 2012/0235162 | A1 * | 9/2012 | Isobe | H01L 25/117 257/E23.079 |
| 2013/0224891 | A1 * | 8/2013 | Takizawa | G01R 1/0408 438/15 |
| 2014/0027891 | A1 * | 1/2014 | Kimura | H01L 24/83 438/122 |
| 2015/0102474 | A1 * | 4/2015 | Kimura | H01L 21/565 257/675 |
| 2016/0086870 | A1 * | 3/2016 | Abe | H01L 24/49 257/712 |
| 2016/0106010 | A1 * | 4/2016 | Ito | H05K 1/0209 361/707 |
| 2018/0220539 | A1 * | 8/2018 | Kaneko | H05K 7/20409 |
| 2019/0295920 | A1 * | 9/2019 | Otremba | H01L 21/4882 |
| 2019/0343007 | A1 * | 11/2019 | Sasaki | H01G 2/06 |
| 2019/0343015 | A1 * | 11/2019 | Besshi | H01L 23/28 |
| 2020/0169148 | A1 * | 5/2020 | Nakamoto | H05K 1/18 |
| 2021/0136917 | A1 * | 5/2021 | Otsubo | H01L 24/16 |
| 2024/0162123 | A1 * | 5/2024 | Hara | H01L 25/07 |

FOREIGN PATENT DOCUMENTS

| | | |
|---|---|---|
| JP | 2019-83349 A | 5/2019 |
| WO | 2020/017582 A1 | 1/2020 |

OTHER PUBLICATIONS

Office Action received in the corresponding German Patent application, Dec. 7, 2022, and machine translation (15 pages).
International Search Report issued in PCT/JP2021/005493, Apr. 20, 2021 (2 pages).
Office Action issued in corresponding Japanese Patent application No. 2022-505862, Sep. 3, 2024 and machine translation (8 pages).

* cited by examiner

ELECTRONIC DEVICE

TECHNICAL FIELD

The present disclosure relates to an electronic device.

BACKGROUND ART

Conventionally, electronic devices called IPM (Intelligent Power Module) are known. Patent Document 1 discloses an example of a conventional IPM. The IPM disclosed in Patent Document 1 includes a plurality of semiconductor elements, a control element, a sealing member and a plurality of terminals. Each of the semiconductor elements is a power semiconductor chip such as an IGBT (Insulated Gate Bipolar Transistor) or a MOSFET (Metal-Oxide-Semiconductor Field-Effect Transistor). The control element is an LSI chip such as a control IC and controls the driving of the semiconductor elements. The sealing member covers the semiconductor elements, the control element and the terminals. The sealing member is made of an insulating resin material such as epoxy resin. Each of the terminals is partially exposed from the sealing resin and supported by the sealing resin. Each terminal is electrically connected to one of the semiconductor elements or the control element inside the sealing resin.

When the IPM is energized, each semiconductor device generates heat. Since such heat may cause unstable operation of the semiconductor elements, improved heat dissipation of the semiconductor elements is demanded. This is a challenge not solely for IPMs but common to a variety of electronic components.

TECHNICAL REFERENCE

Patent Document

Patent Document 1: JP-A-2014-90006

SUMMARY OF THE INVENTION

Problems to be Solved by the Invention

The present disclosure has been conceived under the above-noted circumstances, and an object of the present disclosure is to provide an electronic device with improved heat dissipation of an electronic component.

Means for Solving the Problems

An electronic device provided according to the present disclosure includes: a first electronic component including a first main body and a plurality of first terminals exposed from the first main body; a second electronic component including a second main body and a plurality of second terminals exposed from the second main body; a mounting substrate having a mounting surface on which the first electronic component and the second electronic component are disposed; and a heat dissipator having an attaching surface to which the first electronic component and the second electronic component are attached. The mounting surface and the attaching surface face each other in the thickness direction. The first main body and the second main body are disposed between the mounting substrate and the heat dissipator in a thickness direction and arranged side by side in a first direction orthogonal to the thickness direction. The first main body has a first front surface facing the attaching surface and a first back surface facing the mounting surface. The second main body has a second front surface facing the attaching surface and a second back surface facing the mounting surface. The dimension of the second main body in the thickness direction is smaller than the dimension of the first main body in the thickness direction. The first front surface and the second front surface overlap with each other as viewed in the first direction. A gap is provided between the second back surface and the mounting surface.

Advantages of the Invention

The electronic device according to the present disclosure improves the heat dissipation of the electronic device (first electronic component and second electronic component).

MODE FOR CARRYING OUT THE INVENTION

Figure 1:
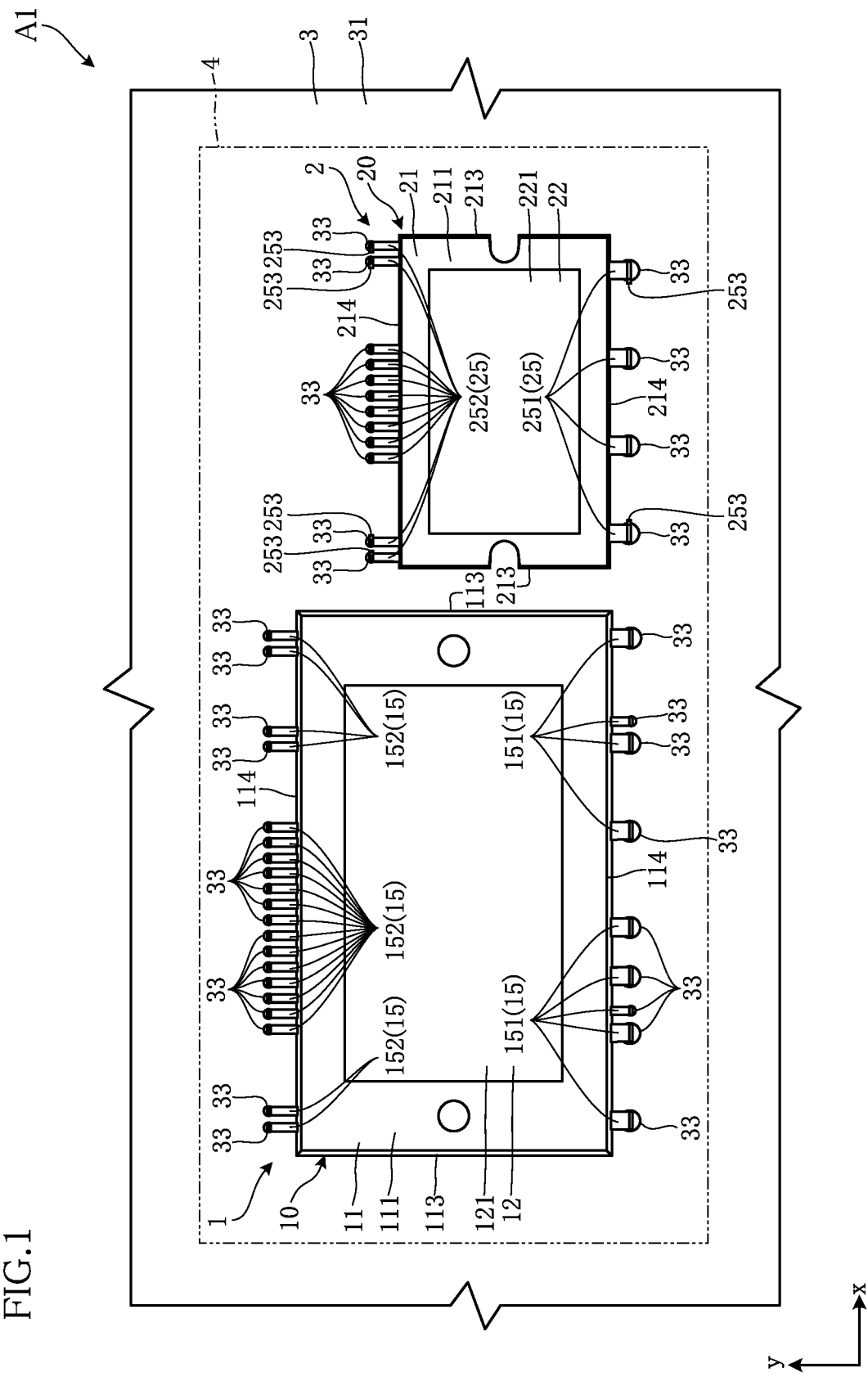
FIG. 1 is a plan view of an electronic device according to a first embodiment.

Preferred embodiments of the electronic device according to the present disclosure are described below with reference to the accompanying drawings.

First Embodiment

FIGS. 1-6 show an electronic device A1 according to a first embodiment. The electronic device A1 includes a first electronic component 1, a second electronic component 2, a mounting substrate 3, a heat dissipator 4, and a plurality of conductive bonding materials 5.

Figure 2:
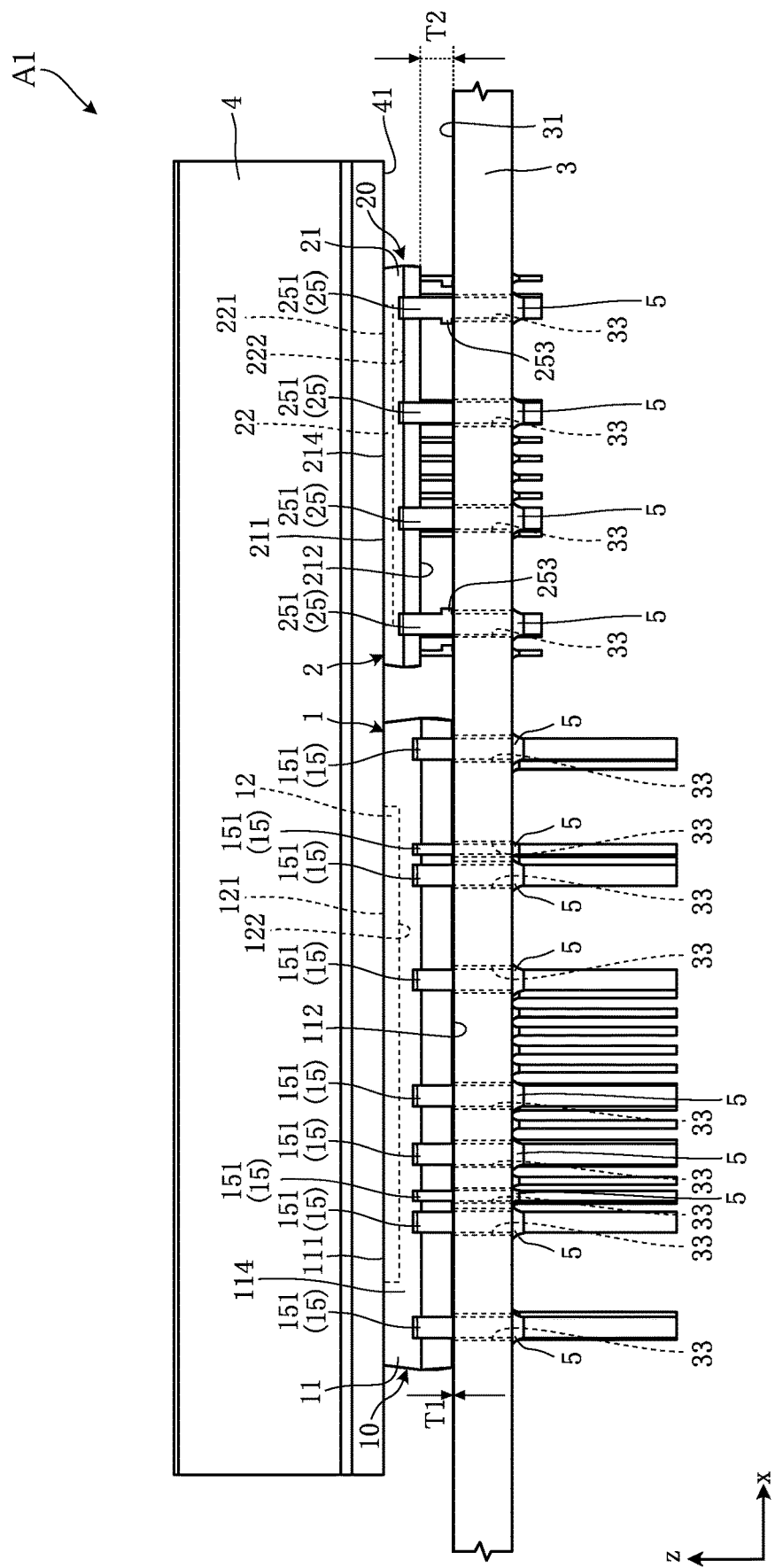
FIG. 2 is a front view of the electronic device according to the first embodiment.
Figure 3:
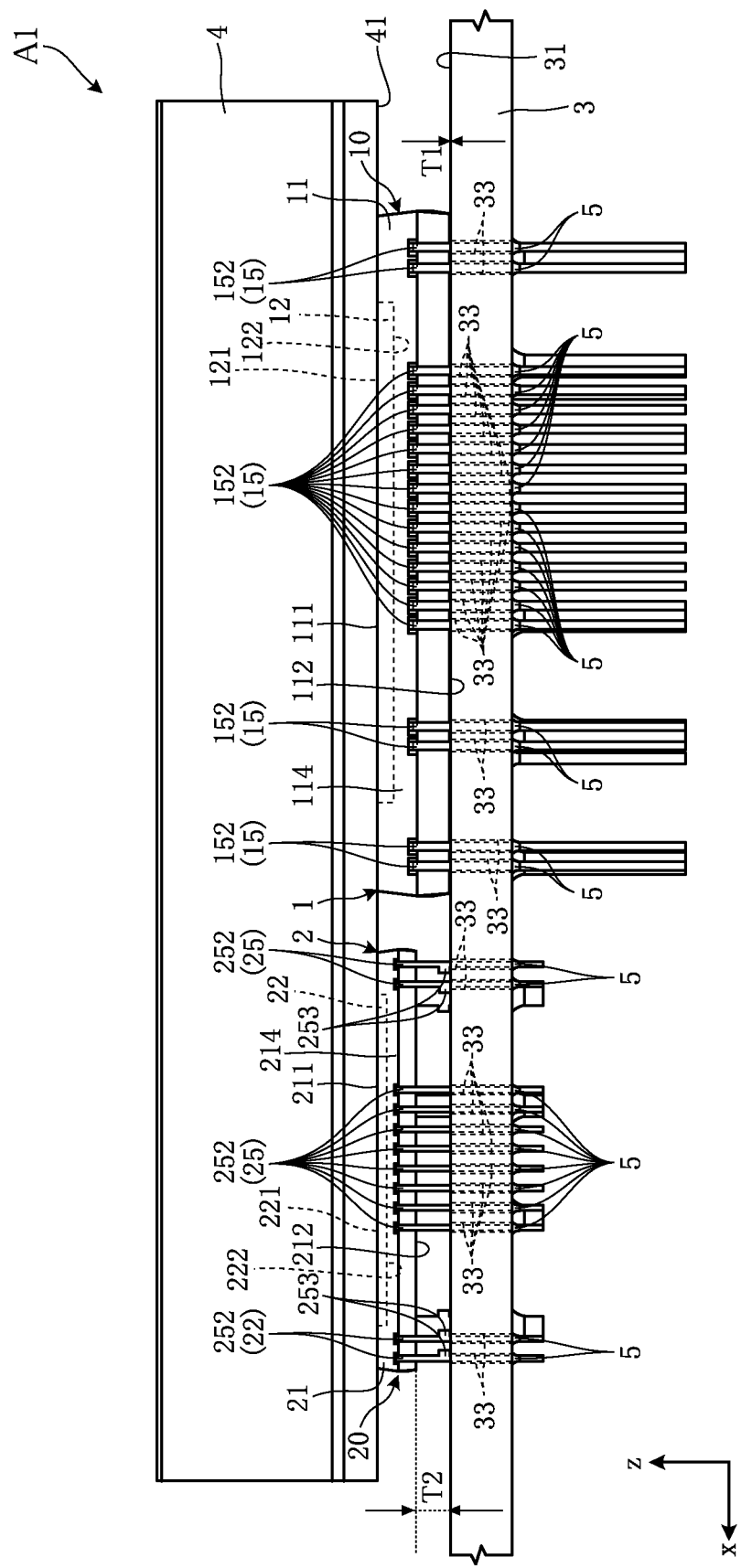
FIG. 3 is a rear view of the electronic device according to the first embodiment.

FIG. 1 is a plan view of the electronic device A1. In FIG. 1, the heat dissipator 4 is shown by an imaginary line (double-dotted line). FIG. 2 is a front view of the electronic device A1. FIG. 3 is a rear view of the electronic device A1.

Figure 4:
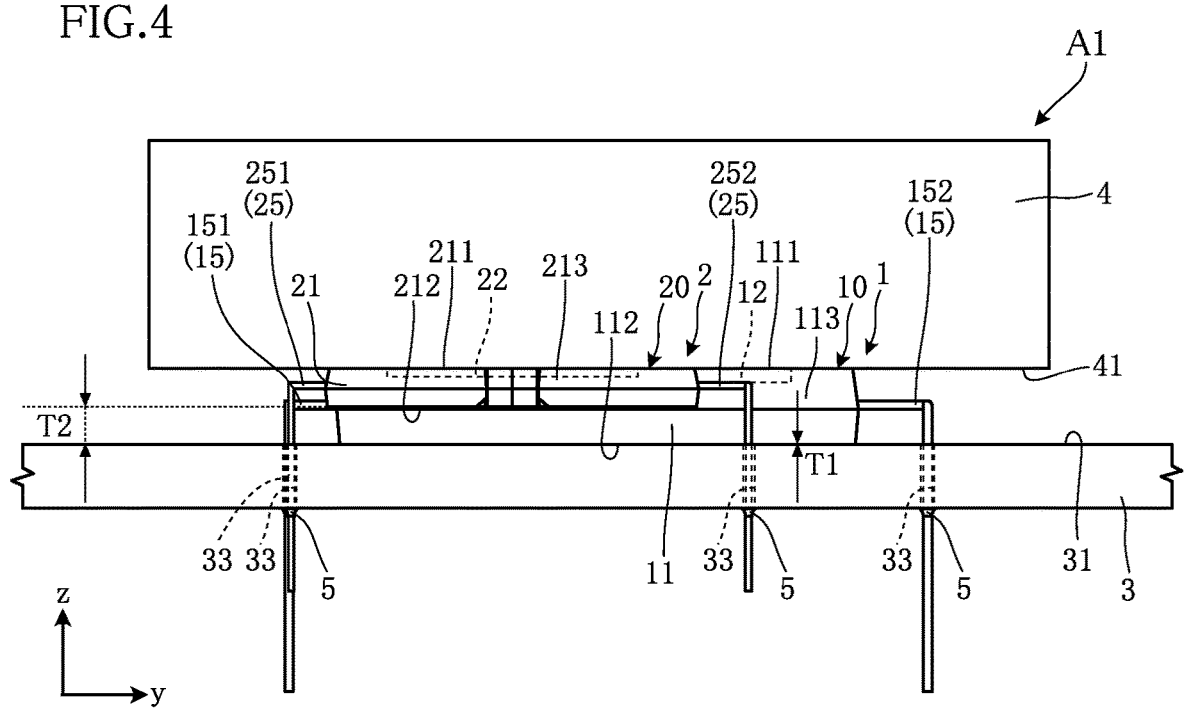
FIG. 4 is a side view (right side view) of the electronic device according to the first embodiment.
Figure 5:
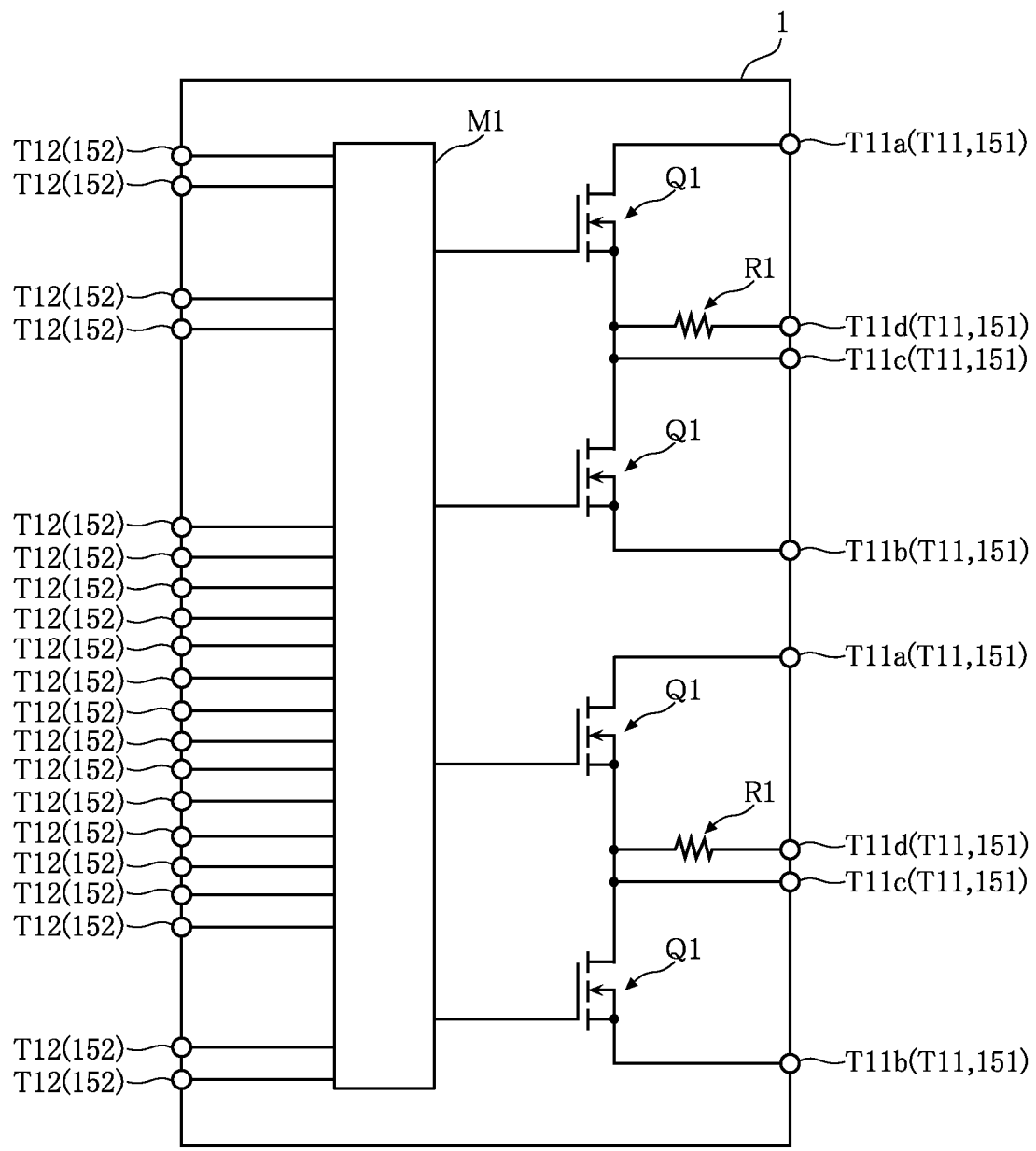
FIG. 5 shows an example of a circuit configuration of a first electronic component.
Figure 6:
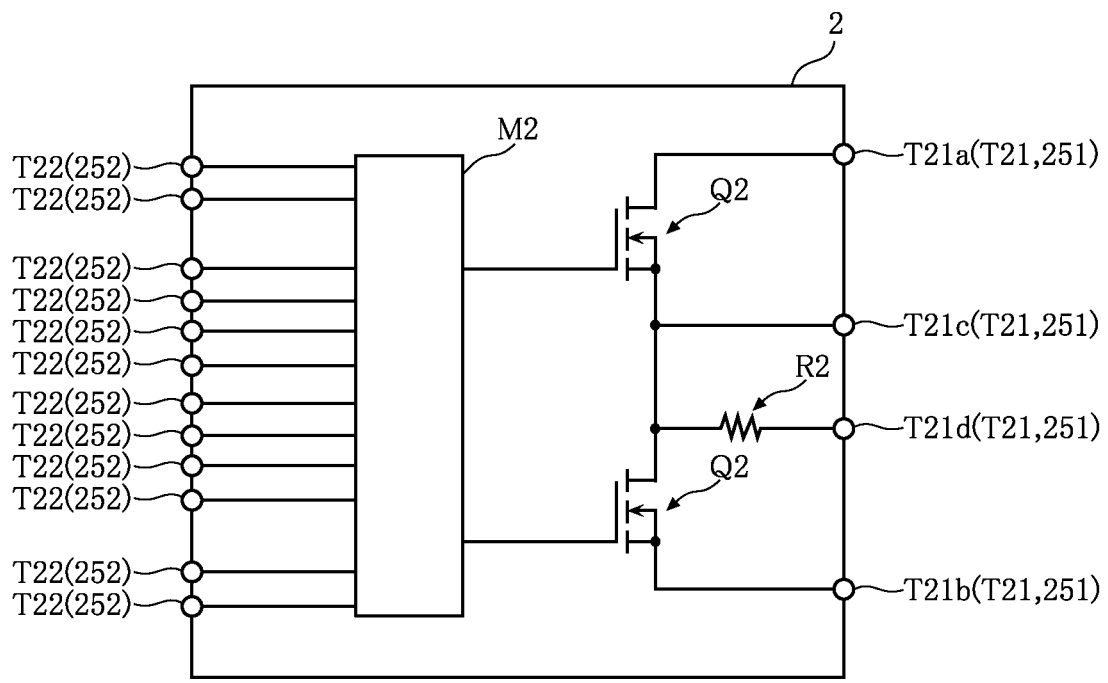
FIG. 6 shows an example of a circuit configuration of a second electronic component.

FIG. 4 is a side view (right side view) of the electronic device A1. FIG. 5 is an example of a circuit diagram of the first electronic component 1. FIG. 6 is an example of a circuit diagram of the second electronic component 2.

For convenience, the three directions that are orthogonal to each other are defined as x direction, y direction and z direction. The z direction is the thickness direction of the electronic device A1. The x direction is the horizontal direction in the plan view (see FIG. 1) of the electronic device A1. The y direction is the vertical direction in the plan view (see FIG. 1) of the electronic device A1. In the description below, one sense in the z direction (upper side in FIG. 4) may be referred to as "upward", and the other sense in the z direction (lower side in FIG. 4) may be referred to as "downward". Also, in the description below, "as viewed in plan" means "as viewed in the z direction". The z direction is an example of the "thickness direction", and the x direction is an example of the "first direction".

Each of the first electronic component 1 and the second electronic component 2 is an IPM, for example. IPM is an abbreviation for intelligent power module, which incorporates a semiconductor element for power and a control element for controlling the semiconductor element in a single package. The first electronic component 1 and the second electronic component 2 are used, for example, for power control in inverter devices or motor control equipment. The first electronic component 1 and the second electronic component 2 are mounted to the mounting substrate 3. The first electronic component 1 and the second electronic component 2 are not limited to IPMs, but may be discrete components or power modules that do not incorporate control elements.

As shown in FIG. 5, the first electronic component 1 includes a plurality of first semiconductor elements Q1, a first control element M1, and a plurality of first terminals T11 and T12. The circuit diagram shown in FIG. 5 is one example, and the circuit diagram may vary depending on the first electronic component 1 used.

Each of the first semiconductor elements Q1 is a power semiconductor chip such as an IGBT, a MOSFET or a diode, for example. In the example shown in FIG. 5, the first electronic component 1 includes four first semiconductor elements Q1, and each of the four first semiconductor elements Q1 is constituted by an n-channel MOSFET. Two of the four first semiconductor elements Q1 are connected in series to form one leg, and the remaining two are connected in series to form another leg. In this way, the first electronic component 1 includes two legs. The connection of the four first semiconductor elements Q1 is not limited to the example shown in FIG. 5. Four example, the four first semiconductor elements Q1 may be connected in a full-bridge, or the four first semiconductor elements Q1 may not be connected to each other. The number of the first semiconductor elements Q1 is not limited to the above-noted example. For example, the first electronic component 1 may include a single first semiconductor element Q1 or may include six first semiconductor elements Q1 connected in a three-phase bridge.

The first control element M1 is an LSI chip such as a control IC, for example. The first control element M1 controls the driving of the first semiconductor elements Q1. Specifically, the first control element M1 inputs a driving signal (e.g., gate voltage) to each of the first semiconductor elements Q1 to control the driving (switching operation) of the first semiconductor elements Q1. The first control element M1 includes a drive circuit. In the example shown in FIG. 5, the single first control element M1 controls the driving of the four first semiconductor elements Q1, but the present disclosure is not limited to such a configuration. For example, the first control element M1 may be provided for each of the two legs, or the first control element M1 may be provided for each of the four first semiconductor elements Q1.

The plurality of first terminals T11 and T12 are the external terminals of the first electronic component 1. As shown in FIG. 5, the first terminals T11 are connected to the first semiconductor elements Q1. The first terminals T11 include a pair of input terminals T11a and T11b, an output terminal T11c and a detection terminal T11d for two first semiconductor elements Q1 connected in series. A power supply voltage is applied to the pair of input terminals T11a and T11b. The input terminal T11a is a P terminal, and the input terminal T11b is an N terminal. The output terminal T11c outputs a voltage input through the pair of input terminals T11a and T11b and converted by the switching operation of the two first semiconductor elements Q1 in each leg. The output terminal T11c is connected to the connection point of the two first semiconductor elements Q1 in each leg. The detection terminal T11d is used to detect the output voltage, and is connected to the connection point of the two first semiconductor elements Q1 in each leg via a shunt resistor R1, for example. The shunt resistors R1 may not be incorporated in the first electronic component 1 but may be disposed outside the first electronic component 1. As shown in FIG. 5, the first terminals T12 are connected to the first control element M1. The plurality of first terminals T12 include those which receive or output various control signals for controlling the first electronic component 1 and those which receive the operating voltage of the first control element M1.

As shown in FIGS. 1-4, the first electronic component 1 is configured as a module including a first main body 10 and a plurality of first terminals 15.

The first main body 10 includes the first semiconductor elements Q1, the first control element M1, a first sealing member 11 and a first support substrate 12.

The first sealing member 11 is a package that covers the first semiconductor elements Q1 and the first control element M1 to protect these from light, heat, moisture, dust and physical shock, for example. The first sealing member 11 is made of an insulating resin material, for example. An example of such a resin material is epoxy resin. As shown in FIG. 1, the first sealing member 11 may be rectangular as viewed in plan.

As shown in FIGS. 1-4, the first sealing member 11 has a front surface 111, a back surface 112 and a plurality of side surfaces 113 and 114. The front surface 111 and the back surface 112 are spaced apart from each other in the z direction and face away from each other in the z direction. In the z direction, the front surface 111 faces the heat dissipator 4, and the back surface 112 faces the mounting substrate 3. The front surface 111 and the back surface 112 are both flat. Each of the side surfaces 113 and 114 is located between the front surface 111 and the back surface 112 in the z direction and connected to the front surface 111 and the back surface 112. The two side surfaces 113 are spaced apart from each other in the x direction and face away from each other in the x direction. The two side surfaces 114 are spaced apart from each other in the y direction and face away from each other in the y direction. The front surface 111 is an example of the "first sealing surface".

Inside the first sealing member 11, the first support substrate 12 supports at least the first semiconductor elements Q1. At least a part of the first support substrate 12 is covered with the first sealing member 11. The first support substrate 12 is provided to quickly dissipate the heat generated in the first semiconductor elements Q1 to the outside of the first electronic component 1. The first support substrate 12 is made of a material with excellent thermal conductivity (e.g., a ceramic material), but is not limited to this. The higher the thermal conductivity of the material for the first support substrate 12 is, the better. However, if the coefficient of thermal expansion of the material for the first support substrate differs greatly from that of the material for the first sealing member 11, problems such as detachment of the first support substrate 12 and the first sealing member 11 may occur. Thus, for the first support substrate 12, it is preferable to use a material with a thermal conductivity higher than that of the material for the first sealing member 11 and a coefficient of thermal expansion close to that of the material for the first sealing member 11. The first main body 10 may not include the first support substrate 12.

As shown in FIGS. 2-4, the first support substrate 12 has a first exposed surface 121 and a first support surface 122 spaced apart from each other in the z direction. The first exposed surface 121 and the first support surface 122 are both flat. The first exposed surface 121 faces (upward) in the z direction and faces the heat dissipator 4 (attaching surface 41 described later). The first exposed surface 121 is exposed from the front surface 111 of the first sealing member 11. As shown in FIG. 1, the front surface 111 is shaped like a frame surrounding the first exposed surface 121, as viewed in plan. The first exposed surface 121 is flush (or approximately flush, which holds true hereinafter) with the front surface 111 in the example shown in FIGS. 2-4, but may be located above the front surface 111. The first support substrate 12 may not have the first exposed surface 121. That is, the first support substrate 12 may be completely covered with the first sealing member 11. The first support surface 122 faces (downward) in the z direction and faces the mounting substrate 3 (mounting surface 31 described later). The first semiconductor elements Q1 are mounted on the first support surface 122.

The first main body 10 has a first front surface and a first back surface. The first front surface is the uppermost surface of the first main body 10 and faces the heat dissipator 4 (attaching surface 41 described later). In the present embodiment, the first front surface is constituted by the front surface 111 (first sealing member 11) and the first exposed surface 121 (first support substrate 12). In a configuration different from the present embodiment, when the first support substrate 12 is not exposed from the first sealing member 11 or the first main body 10 does not include the first support substrate 12, the first front surface is constituted by the front surface 111 (first sealing member 11). When the first exposed surface 121 is located above the front surface 111, the first front surface is constituted by the first exposed surface 121. The first back surface is the lowermost surface of the first main body 10 and faces the mounting substrate 3 (mounting surface 31 described later). In the present embodiment, the first back surface is constituted by the back surface 112 (first sealing member 11).

Each of the first terminals 15 is partially covered with the first sealing member 11 and partially exposed from the first sealing member 11. Inside the first sealing member 11, the first terminals 15 are electrically connected to the first semiconductor elements Q1 or the first control element M1. The first terminals 15 correspond to the first terminals T11 or T12 in the circuit configuration (see FIG. 5) of the first electronic component 1.

The material for the first terminals 15 is not limited, and copper (Cu), aluminum, iron (Fe), oxygen-free copper, or their alloys (e.g., Cu—Sn alloy, Cu—Zr alloy or Cu—Fe alloy) may be used. Each of the first terminals 15 may be plated with nickel (Ni).

As shown in FIGS. 1-3, each of the first terminals 15 projects from one of the two side surfaces 114. Unlike this, each of the first terminals 15 may project from one of the two side surfaces 113. Each of the first terminals 15 may project from the back surface 112. The first terminals 15 are configured as the insertion mount type. Each of the first terminals 15 is partially bent and includes a portion extending along the y direction from one of the two side surfaces 114 and a portion extending along the z direction.

The first terminals 15 include a plurality of first power terminals 151 and a plurality of first control terminals 152. The first power terminals 151 are electrically connected to the first semiconductor elements Q1 inside the first sealing member 11. The first power terminals 151 correspond to the first terminals T11 in the circuit configuration (see FIG. 5) of the first electronic component 1. The first control terminals 152 are electrically connected to the first control element M1 inside the first sealing member 11. The first control terminals 152 correspond to the first terminals T12 in the circuit configuration (see FIG. 5) of the first electronic component 1.

As shown in FIG. 6, the second electronic component 2 includes a plurality of second semiconductor elements Q2, a second control element M2, and a plurality of second terminals T21 and T22. The circuit diagram shown in FIG. 6 is one example, and the circuit diagram may vary as appropriate depending on the second electronic component 2 used.

Each of the second semiconductor elements Q2 is a power semiconductor chip such as an IGBT, a MOSFET or a diode. The number of the second semiconductor elements Q2 is smaller than that of the first semiconductor elements Q1. In the example shown in FIG. 6, the second electronic component 2 includes two second semiconductor elements Q2, and each of the two second semiconductor elements Q2 is constituted by an n-channel MOSFET. The two semiconductor elements Q2 are connected in series to form a leg. The connection of the two second semiconductor elements Q2 is not limited to the example shown in FIG. 6. Four example, the two semiconductor elements Q2 may not be connected to each other. The number of the two semiconductor elements Q2 is not limited to the above-noted example. For example, the second electronic component 2 may include a single second semiconductor element Q2, four second semiconductor elements Q2 connected in a full-bridge, or six second semiconductor elements Q2 connected in a three-phase bridge.

The second control element M2 is an LSI chip such as a control IC, for example. The second control element M2 controls the driving of the second semiconductor elements Q2. Specifically, the second control element M2 inputs a driving signal (e.g., gate voltage) to each of the second semiconductor elements Q2 to control the driving (switching operation) of the second semiconductor elements Q2. The second control element M2 includes a drive circuit. In the example shown in FIG. 6, the single second control element M2 controls the driving of the two second semiconductor elements Q2, but the present disclosure is not limited to such a configuration. For example, the second control element M2 may be provided for each of the two semiconductor elements Q2.

The plurality of second terminals T21 and T22 are the external terminals of the second electronic component 2. As shown in FIG. 6, the second terminals T21 are connected to the second semiconductor elements Q2. The second terminals T21 include a pair of input terminals T21$a$ and T21$b$, an output terminal T21$c$ and a detection terminal T21$d$. A power supply voltage is applied to the pair of input terminals T21$a$ and T21$b$. The input terminal T21$a$ is a P terminal, and the input terminal T21$b$ is an N terminal. The output terminal T21$c$ outputs a voltage input through the pair of input terminals T21$a$ and T21$b$ and converted by the switching operation of the two second semiconductor elements Q2. The output terminal T21$c$ is connected to the connection point of the two second semiconductor elements Q2. The detection terminal T21$d$ is used to detect the output voltage, and is connected to the connection point of the two second semiconductor elements Q2 via a shunt resistor R2, for example. The shunt resistor R2 may not be incorporated in the second electronic component 2 but may be disposed outside the second electronic component 2. As shown in FIG. 6, the second terminals T22 are connected to the second control element M2. The plurality of second terminals T22 include those which receive or output various control signals for controlling the second electronic component 2 and those which receive the operating voltage of the second control element M2.

As shown in FIGS. 1-4, the second electronic component 2 is configured as a module including a second main body 20 and a plurality of second terminals 25.

The second main body 20 includes the second semiconductor elements Q2, the second control element M2, a second sealing member 21 and a second support substrate 22.

The second sealing member 21 is a package that covers the second semiconductor elements Q2 and the second control element M2 to protect these from light, heat, moisture, dust and physical shock, for example. The second sealing member 21 is made of an insulating resin material, for example. An example of such a resin material is epoxy resin. As shown in FIG. 1, the second sealing member 21 may be rectangular as viewed in plan.

As shown in FIGS. 1-4, the second sealing member 21 has a front surface 211, a back surface 212 and a plurality of side surfaces 213 and 214. The front surface 211 and the back surface 212 are spaced apart from each other in the z direction and face away from each other in the z direction. In the z direction, the front surface 211 faces the heat dissipator 4, and the back surface 212 faces the mounting substrate 3. The front surface 211 and the back surface 212 are both flat. The front surface 211 is in a same x-y plane (plane orthogonal to the z direction) as the front surface 111 (first sealing member 11). Each of the side surfaces 213 and 214 is located between the front surface 211 and the back surface 212 in the z direction and connected to the front surface 211 and the back surface 212. The two side surfaces 213 are spaced apart from each other in the x direction and face away from each other in the x direction. The two side surfaces 214 are spaced apart from each other in the y direction and face away from each other in the y direction. The front surface 211 is an example of the "second sealing surface".

Inside the second sealing member 21, the second support substrate 22 supports at least the second semiconductor elements Q2. At least a part of the second support substrate 22 is covered with the second sealing member 21. The second support substrate 22 is provided to quickly dissipate the heat generated in the second semiconductor elements Q2 to the outside of the second electronic component 2. The second support substrate 22 is made of a material with excellent thermal conductivity (e.g., a ceramic material), but is not limited to this. The higher the thermal conductivity of the material for the second support substrate 22 is, the better. However, if the coefficient of thermal expansion of the material for the second support substrate differs greatly from that of the material for the second sealing member 21, problems such as detachment of the second support substrate 22 and the second sealing member 21 may occur. Thus, for the second support substrate 22, it is preferable to use a material with a thermal conductivity higher than that of the material for the second sealing member 21 and a coefficient of thermal expansion close to that of the material for the second sealing member 21. The second main body 20 may not include the second support substrate 22.

As shown in FIGS. 2-4, the second support substrate 22 has a second exposed surface 221 and a second support surface 222 spaced apart from each other in the z direction. The second exposed surface 221 and the second support surface 222 are both flat. The second exposed surface 221 faces upward in the z direction and faces the heat dissipator 4 (attaching surface 41 described later). The second exposed surface 221 is exposed from the front surface 211 of the second sealing member 21. As shown in FIG. 1, the front surface 211 is shaped like a frame surrounding the second exposed surface 221, as viewed in plan. The second exposed surface 221 is flush with the front surface 211 in the example shown in FIGS. 2-4, but may be located above the front surface 211. The second support substrate 22 may not have the second exposed surface 221. That is, the second support substrate 22 may be completely covered with the second sealing member 21. The second support surface 222 faces downward and faces the mounting substrate 3 (mounting surface 31 described later). The second semiconductor elements Q2 are mounted on the second support surface 222.

The second main body 20 has a second front surface and a second back surface. The second front surface is the uppermost surface of the second main body 20 and faces the heat dissipator 4 (attaching surface 41 described later). In the present embodiment, the second front surface is constituted by the front surface 211 (second sealing member 21) and the second exposed surface 221 (second support substrate 22). In a configuration different from the present embodiment, when the second support substrate 22 is not exposed from the second sealing member 21 or the second main body 20 does not include the second support substrate 22, the second front surface is constituted by the front surface 211 (second sealing member 21). When the second exposed surface 221 is located above the front surface 211, the second front surface is constituted by the second exposed surface 221. The second back surface is the lowermost surface of the second main body 20 and faces the mounting substrate 3 (mounting surface 31 described later). In the present embodiment, the second back surface is constituted by the back surface 212 (second sealing member 21).

Each of the second terminals 25 is partially covered with the second sealing member 21 and partially exposed from the second sealing member 21. Inside the second sealing member 21, the second terminals 25 are electrically connected to the second semiconductor elements Q2 or the second control element M2. The second terminals 25 correspond to the second terminals T21 or T22 in the circuit configuration (see FIG. 6).

The material for the second terminals 25 is not limited, and copper (Cu), aluminum, iron (Fe), oxygen-free copper, or their alloys (e.g., Cu—Sn alloy, Cu—Zr alloy or Cu—Fe alloy) may be used. Each of the second terminals 25 may be plated with nickel (Ni).

As shown in FIGS. 1-3, each of the second terminals 25 projects from one of the two side surfaces 214. Unlike this, each of the second terminals 25 may project from one of the two side surfaces 213. Each of the second terminals 25 may project from the back surface 212. The second terminals 25 are configured as the insertion mount type. Each of the second terminals 25 is partially bent and includes a portion extending along the y direction from one of the two side surfaces 214 and a portion extending along the z direction.

The second terminals 25 include a plurality of second power terminals 251 and a plurality of second control terminals 252. The second power terminals 251 are electrically connected to the second semiconductor elements Q2 inside the second sealing member 21. The second power terminals 251 correspond to the second terminals T21 in the circuit configuration (see FIG. 6) of the second electronic component 2. The second control terminals 252 are electrically connected to the second control element M2 inside the second sealing member 21. The second control terminals 252 correspond to the second terminals T22 in the circuit configuration (see FIG. 6) of the second electronic component 2.

As shown in FIGS. 1-3, of the plurality of second terminals 25, the second terminals 25 disposed near the four corners as viewed in plan are each formed with a second projection 253. As shown in FIGS. 1-3, in each of these second terminals 25, the second projection 253 projects in the x direction. Note that the second projections 253 are not limited to those projecting in the x direction and may project in any direction orthogonal to the z direction. As shown in FIGS. 2 and 3, the second projections 253 are provided between the back surface 212 and the mounting substrate 3 (mounting surface 31 described later). The second projection 253 may be formed on one or more of the second terminals 25 and may be formed on all second terminals 25, for example. Alternatively, no second terminals 25 may be formed with the second projection 253. However, to stabilize the posture of the second electronic component 2, it is desirable that at least the second terminals 25 disposed near the four corners as viewed in plan are provided with the second projections 253.

The first electronic component 1 and the second electronic component 2 are mounted to the mounting substrate 3. The mounting substrate 3 is a circuit board used for electronic equipment, for example. The mounting substrate 3 is made of an insulating material and may be a PCB. The mounting substrate 3 is formed with an interconnect pattern (not shown). The first terminals 15 of the first electronic component 1 and the second terminals 25 of the second electronic component 2 are electrically connected to the interconnect pattern formed on the mounting substrate 3.

The mounting substrate 3 has a mounting surface 31 facing one sense of the z direction (upward). The mounting surface 31 is flat. The mounting surface 31 faces the first electronic component 1 and the second electronic component 2. The first electronic component 1 and the second electronic component 2 are disposed on the mounting surface 31. As shown in FIGS. 2-4, the back surface 112 of the first sealing member 11 is in contact with the mounting surface 31, whereas the back surface 212 of the second sealing member 21 is spaced apart from the mounting surface 31. In the illustrated example, the first electronic component 1 and the second electronic component 2 are arranged side by side in the x direction, but the present disclosure is not limited to this. For example, the first electronic component 1 and the second electronic component 2 may be arranged side by side in a direction different from the x direction on the mounting surface 31.

As shown in FIGS. 1-4, the mounting substrate 3 is formed with a plurality of through-holes 33. Each of the through-holes 33 penetrates the mounting substrate 3 in the z direction. In each through-hole 3, one of the first terminals 15 of the first electronic component 1 or one of the second terminals 25 of the second electronic component is inserted. In FIG. 2, the through-holes 33 in which the first power terminals 151 of the first terminals 15 or the second power terminals 251 of the second terminals 25 are inserted are shown by hidden lines (broken lines). In FIG. 3, the through-holes 33 in which the first control terminals 152 of the first terminals 15 or the second control terminal 252 of the second terminals 25 are inserted are shown by hidden lines (broken lines).

As shown in FIGS. 2 and 3, when the second terminals 25 are inserted in the through-holes 33, the respective lower edges of the second projections 253 are in contact with the mounting surface 31. Specifically, each of the second projections 253 is caught on the mounting substrate 3, so that the second electronic component 2 is mounted to the mounting substrate 3 with a gap formed between the back surface 212 of the second sealing member 21 and the mounting surface 31.

The heat dissipator 4 is made of a material with a relatively high thermal conductivity, which may be a metal such as aluminum. The heat dissipator 4 is attached to the first electronic component 1 and the second electronic component 2. For example, the heat dissipator 4 is bonded to the first front surface of the first main body 10 (the front surface 111 of the first sealing member 11 and the first exposed surface 121 of the first support substrate 12) and to the second front surface of the second main body 20 (the front surface 211 of the second sealing member 21 and the second exposed surface 221 of the second support substrate 22) with an adhesive (not shown). The heat dissipator 4 may be fixed to the mounting substrate 3 with a fixture (not shown). In such a case, the heat dissipator 4 may not be bonded to the first front surface of the first main body 10 or the second front surface of the second main body 20 but may only be held in direct contact with these surfaces.

The heat dissipator 4 has an attaching surface 41 facing one sense of the z direction (downward). The attaching surface 41 is flat. The attaching surface 41 faces the first electronic component 1 and the second electronic component 2. The first electronic component 1 and the second electronic component 2 are attached to the attaching surface 41. As shown in FIGS. 2-4, the attaching surface 41 is in contact with the front surface 111 of the first sealing member 11 and the front surface 211 of the second sealing member 21. An adhesive or a heat conductive sheet may be interposed between the attaching surface 41 and the front surface 111 or the front surface 211. The upper side (opposite the attaching surface 41 in the z direction) of the heat dissipator 4 is formed with a so-called fin provided with a number of pins like a kenzan (flower frog) or with plates like a bellows.

As shown in FIGS. 2-4, the conductive bonding materials 5 are formed on the surface of the mounting substrate 3 that faces away from the mounting surface 31 in the z direction. The conductive bonding materials 5 bond the first electronic component 1 and the second electronic component 2 to the mounting substrate 3 while electrically connecting the first terminals 15 of the first electronic component 1 and the second terminals 25 of the second electronic component 2 to the interconnect pattern of the mounting substrate 3. The material for the conductive bonding materials 5 is not limited, and solder may be used, for example.

In the electronic device A1, the dimension of the first main body 10 (first sealing member 11) in the z direction and the dimension of the second main body 20 (second sealing member 21) in the z direction differ from each other. In the electronic device A1, the dimension of the second main body 20 in the z direction is smaller than the dimension of the first main body 10 in the z direction, because the number of the second semiconductor elements Q2 incorporated in the second electronic component 2 is smaller than the number of the first semiconductor elements Q1 incorporated in the first electronic component 1. The cause of the difference between the dimension of the first main body 10 in the z direction and the dimension of the second main body 20 in the z direction is not limited to the difference between the number of the first semiconductor elements Q1 and the number of the second semiconductor elements Q2. For example, different packaging standards may be adopted for the first electronic component 1 and the second electronic component 2, which may result in the difference between the dimension of the first main body 10 in the z direction and that of the second main body 20. Also, the first semiconductor elements Q1 and the second semiconductor elements Q2, which are used in the first electronic component 1 and the second electronic component 2, respectively, may differ in size from each other, which may result in the difference between the dimension of the first main body 10 in the z direction and that of the second main body 20.

As shown in FIGS. 2-4, in the electronic device A1, the first back surface of the first main body 10 (back surface 112 of the first sealing member 11) is in contact with the mounting surface 31, whereas a gap exists between the second back surface of the second main body 20 (back surface 212 of the second sealing member 21) and the mounting surface 31. Thus, the separation distance T2 between the back surface 212 and the mounting surface 31 in the z direction is larger than the separation distance T1 between the back surface 112 and the mounting surface 31 in the z direction (T1=0 in the illustrated example). The separation distance T2 is set appropriately in accordance with the difference between the dimension of the first sealing member 11 in the z direction and the dimension of the second sealing member 21 in the z direction. Specifically, the separation distance T2 is set such that the difference (T2−T1) between the separation distance T2 and the separation distance T1 corresponds to the difference between the dimension of the first main body 10 in the z direction and the dimension of the second main body 20 in the z direction.

The advantages of the electronic device A1 according to the first embodiment are as follows.

The electronic device A1 includes the heat dissipator 4 attached to the first electronic component 1 and the second electronic component 2. Thus, even when the first electronic component 1 and the second electronic component 2 generate heat during the energization of the electronic device A1, such heat is dissipated through the heat dissipator 4. In this way, the electronic device A1 enhances the heat dissipation from the first electronic component 1 and the second electronic component 2.

In the electronic device A1, a gap is provided between the second back surface of the second main body 20 (back surface 212 of the second sealing member 21) and the mounting surface 31 (mounting substrate 3). Such an arrangement makes it possible to arrange the first front surface of the first main body 10 (front surface 111 and first exposed surface 121) and the second front surface of the second main body 20 (front surface 211 and second exposed surface 221) within a same x-y plane when the dimension of the second main body 20 in the z direction is smaller than the dimension of the first main body 10 in the z direction. In other words, the first front surface of the first main body 10 and the second front surface of the second main body 20 can be made overlap with each other as viewed in the x direction. Unlike the illustrated example, when no gap is provided between the second back surface of the second main body 20 and the mounting surface 31, the difference between the dimension of the first main body 10 in the z direction and the dimension of the second main body 20 in the z direction results in a step being formed between the first front surface and the second front surface. In such a case, the heat dissipator 4 common to the first electronic component 1 and the second electronic component 2 cannot be provided, and a heat dissipator needs to be provided separately for each electronic component. This complicates the manufacture and maintenance of the electronic device. The electronic device A1 eliminates such a step between the first front surface of the first main body 10 and the second front surface of the second main body 20 to allow the attachment of the heat dissipator 4 common to the first electronic component 1 and the second electronic component 2, which simplifies manufacture and maintenance.

In the example shown in FIGS. 1-4, the first main body 10 is larger than the second main body 20 in dimension in the z direction and also in size as viewed in plan. Thus, in the present embodiment, the first electronic component 1 is heavier than the second electronic component 2. In the electronic device A1, the main body of the first electronic component 1 is directly supported by the mounting substrate 3, with no gap provided between the first back surface of the first main body 10 (back surface 112 of the first sealing member 11) and the mounting surface 31 (mounting substrate 3), and with the first back surface of the first main body 10 held into contact with the mounting surface 31. This is effective in preventing the first terminals 15 of the first electronic component 1 from bending.

In the electronic device A1, selected ones of the second terminals 25 (second electronic component 2) are each formed with a second projection 253. With such a configuration, each of the second projections 253 engages with the mounting surface 31 to prevent the second main body 20 from approaching the mounting substrate 3 across the predetermined separation distance. That is, the separation distance T2 is reliably maintained between the second back surface of the second main body 20 (back surface 212 of second sealing member 21) and the mounting surface 31.

Second Embodiment

Figure 7:
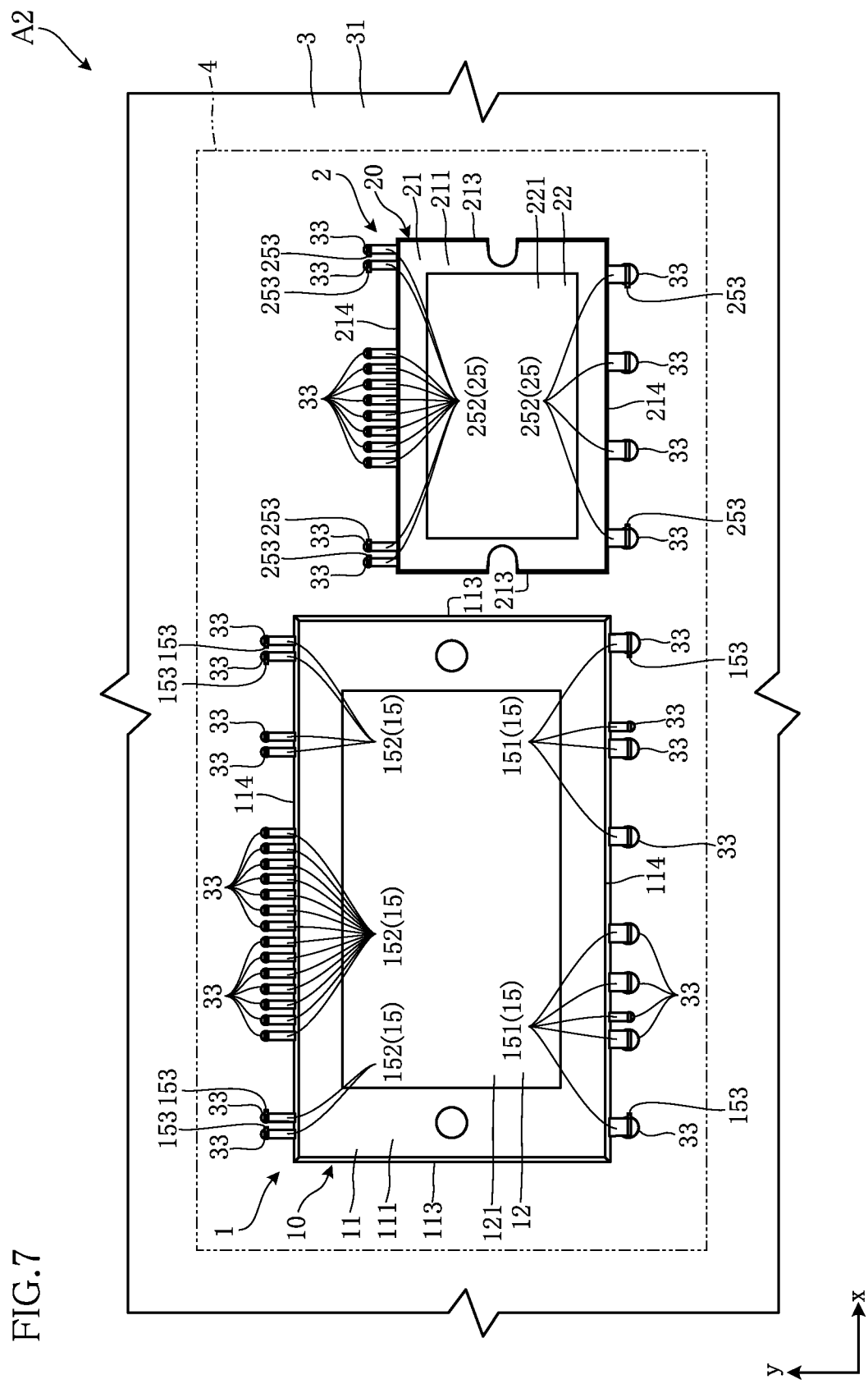
FIG. 7 is a plan view of an electronic device according to a second embodiment.
Figure 8:
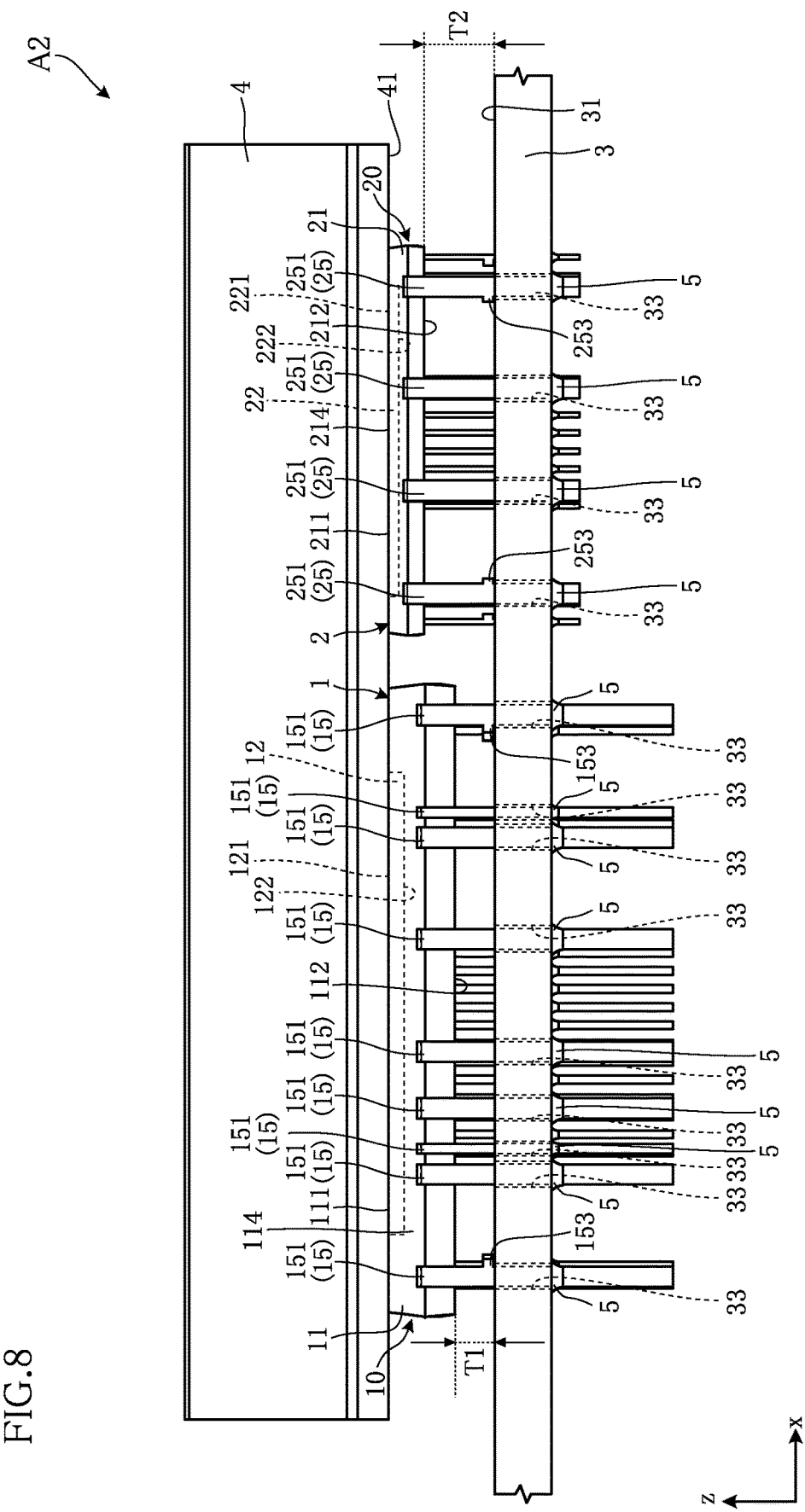
FIG. 8 is a front view of the electronic device according to the second embodiment.
Figure 9:
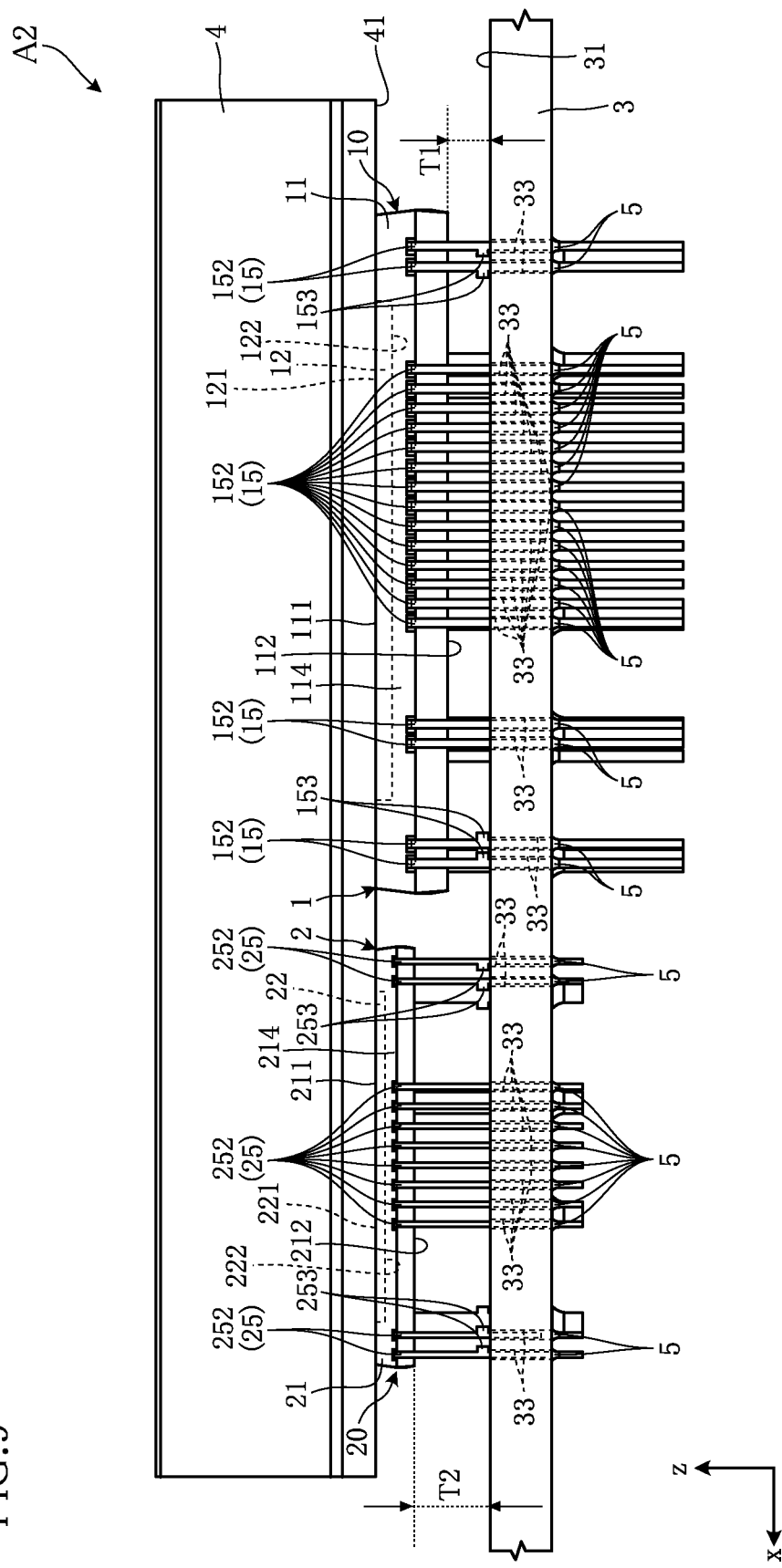
FIG. 9 is a rear view of the electronic device according to the second embodiment.
Figure 10:
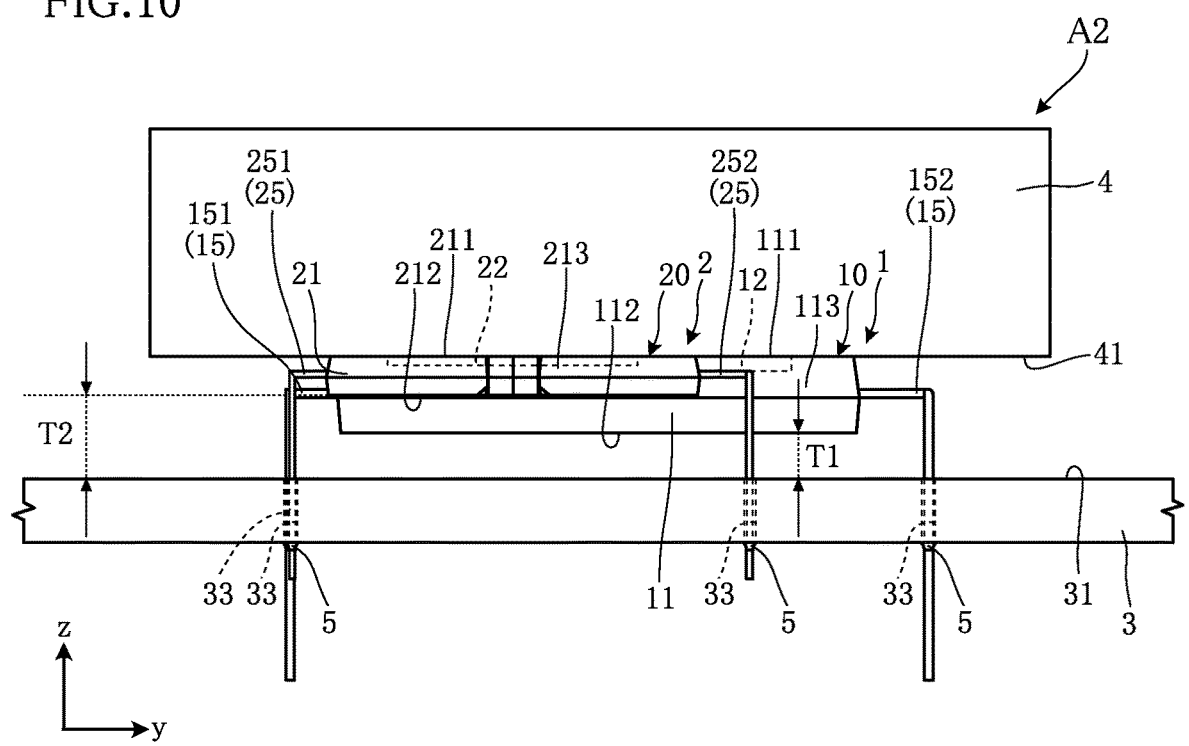
FIG. 10 is a side view (right side view) of the electronic device according to the second embodiment.

FIGS. 7-10 show an electronic device A2 according to a second embodiment. FIG. 7 is a plan view of the electronic device A2, in which the heat dissipator 4 is shown by an imaginary line. FIG. 8 is a front view of the electronic device A2. FIG. 9 is a rear view of the electronic device A2. FIG. 10 is a side view (right side view) of the electronic device A2.

As shown in FIGS. 7-10, the electronic device A2 differs from the electronic device A1 in that a gap is provided also between the first back surface of the first main body 10 (back surface 112 of the first sealing member 11) and the mounting surface 31 (mounting substrate 3).

As mentioned above, the electronic device A2 has a gap between the back surface 112 and the mounting surface 31, as shown in FIGS. 8-10. That is, in the electronic device A2, the separation distance T1 between the back surface 112 and the mounting surface 31 is made larger than the separation distance T1 in the first embodiment. Thus, the separation distance T2 between the back surface 212 and the mounting surface 31 is made larger than the separation distance T2 in the first embodiment by the amount of the increased separation distance T1. In the present embodiment again, the separation distance T2 between the back surface 212 and the mounting surface 31 is larger than the separation distance T1 between the back surface 112 and the mounting surface 31.

In the electronic device A2, the first terminals 15 disposed near the four corners as viewed in plan are each formed with a first projection 153. As shown in FIGS. 7-9, in each of these first terminals 15, the first projection 153 projects in the x direction. Note that the first projections 153 are not limited to those projecting in the x direction and may project in any direction orthogonal to the z direction. The first projections 153 have the same shape as the second projections 253. As shown in FIGS. 7-9, the first projections 153 are disposed between the back surface 112 and the mounting surface 31. The first projection 153 may be formed on one or more of the first terminals 15 and may be formed on all first terminals 15, for example. Alternatively, no first terminals 15 may be formed with the first projection 153. However, to stabilize the posture of the first electronic component 1, it is desirable that at least the first terminals 15 disposed near the four corners as viewed in plan are provided with the first projections 153.

As shown in FIGS. 8 and 9, when the first terminals 15 are inserted in the through-holes 33, the respective lower edges of the first projections 153 are in contact with the mounting surface 31. Specifically, each of the first projections 153 is caught on the mounting substrate 3, so that the first electronic component 1 is mounted to the mounting substrate 3 with a gap formed between the back surface 112 of the first sealing member 11 and the mounting surface 31.

As with the electronic device A1, the electronic device A2 includes the heat dissipator 4 attached to the first electronic component 1 and the second electronic component 2. Thus, the electronic device A2 enhances the heat dissipation from the first electronic component 1 and the second electronic component 2. The electronic device A1 also eliminates a step between the first front surface of the first main body 10 (mainly the front surface 111 of the first sealing member 11) and the second front surface of the second main body 20 (mainly the front surface 211 of the second sealing member 21) to allow the attachment of the heat dissipator 4 common to the first electronic component 1 and the second electronic component 2. Thus, the manufacture and maintenance of the device is relatively easy.

In the electronic device A2, selected ones of the first terminals 15 (first electronic component 1) are each formed with a first projection 153. With such an arrangement, each of the first projections 153 engages with the mounting surface 31 to prevent the first main body 10 from further approaching the mounting substrate 3. That is, the separation distance T1 is reliably maintained between the first back surface of the first main body 10 (back surface 112 of first sealing member 11) and the mounting surface 31.

In the first embodiment and the second embodiment, the shape of each first projection 153 and each second projection 253 is not limited to the above example, and may be any shape that does not pass through the through-holes 33 but is caught on the mounting surface 31. Also, selected ones of the first terminals 15 each may be relatively thick at a portion above the mounting surface 31 in the z direction and relatively thin at a portion below the mounting surface 31 in the z direction, rather than being formed with a first projection 153. In such a case, the diameter of the relatively thick portion is made larger than the diameter of the through-holes 33. With such an arrangement, the thick portions of these first terminals 15 are caught on the mounting surface 31, so that the separation distance T1 is reliably secured. Similarly, selected ones of the second terminals 25 each may also be relatively thick at a portion above the mounting surface 31 in the z direction and relatively thin at a portion below the mounting surface 31 in the z direction, rather than being formed with a second projection 253. In such a case, the diameter of the relatively thick portion is made larger than the diameter of the through-holes 33. With such an arrangement, the thick portions of these second terminals 25 are caught on the mounting surface 31, so that the separation distance T2 is reliably secured.

Third Embodiment

Figure 11:
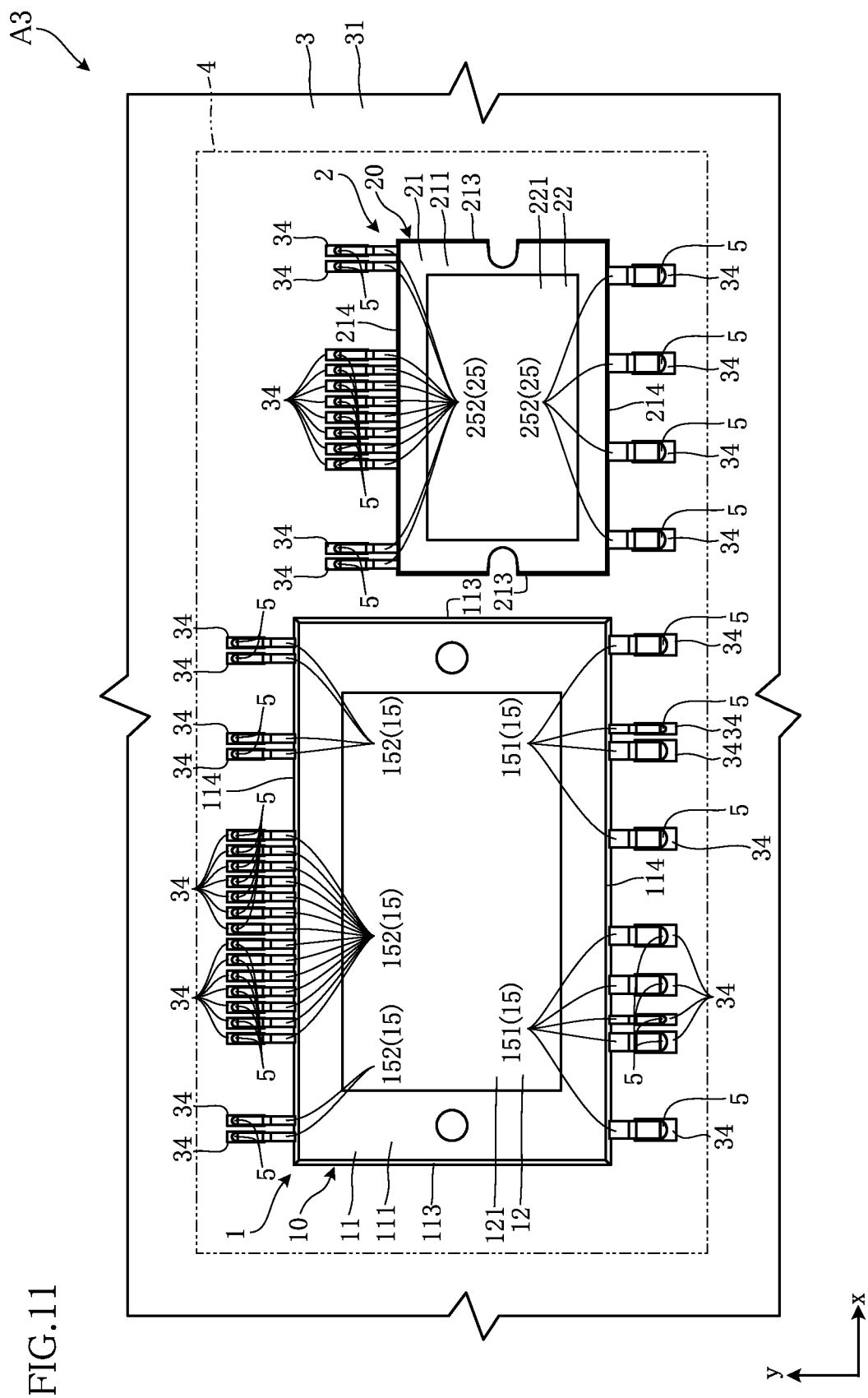
FIG. 11 is a plan view of an electronic device according to a third embodiment.
Figure 12:
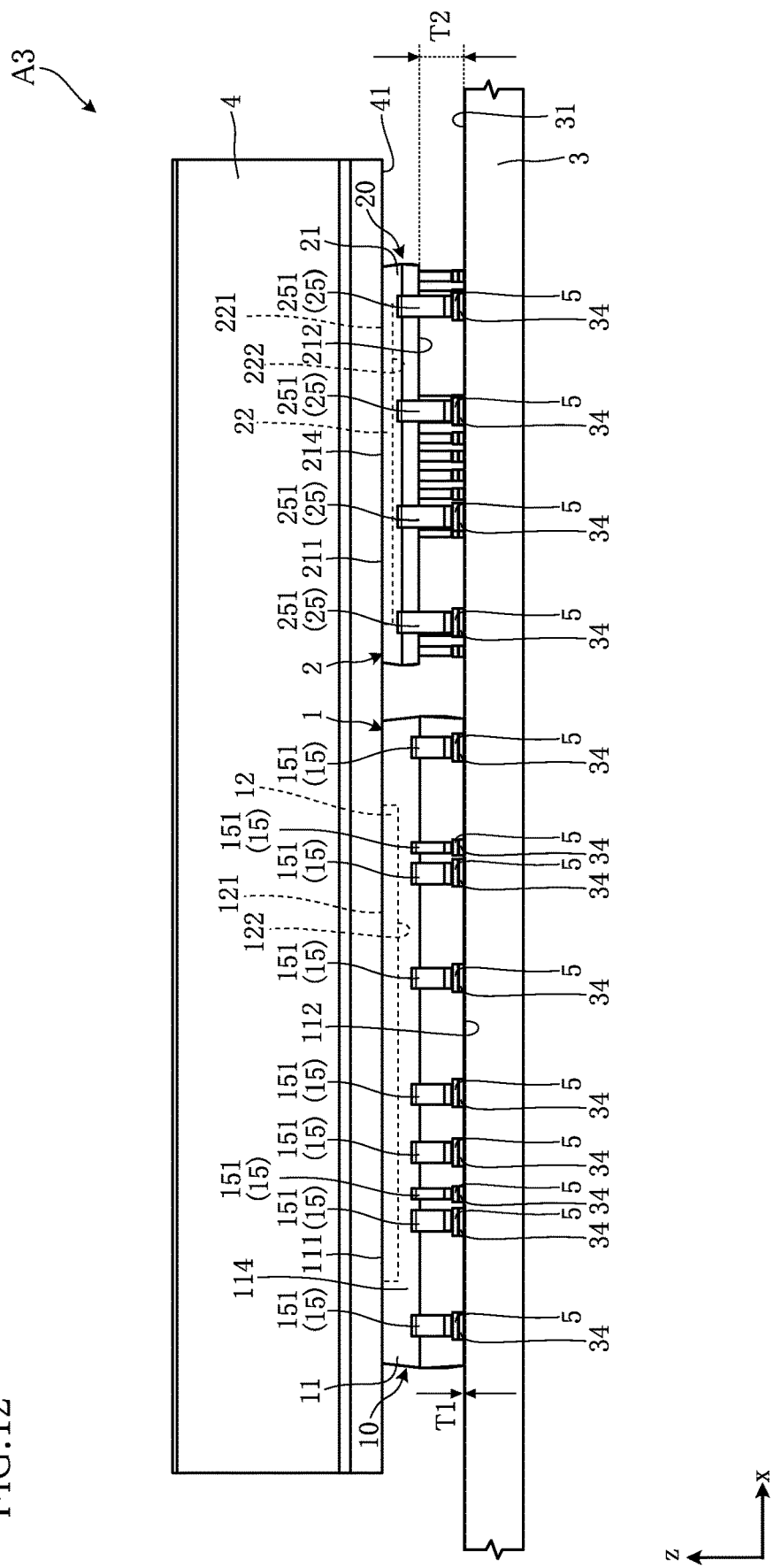
FIG. 12 is a front view of the electronic device according to the third embodiment.
Figure 13:
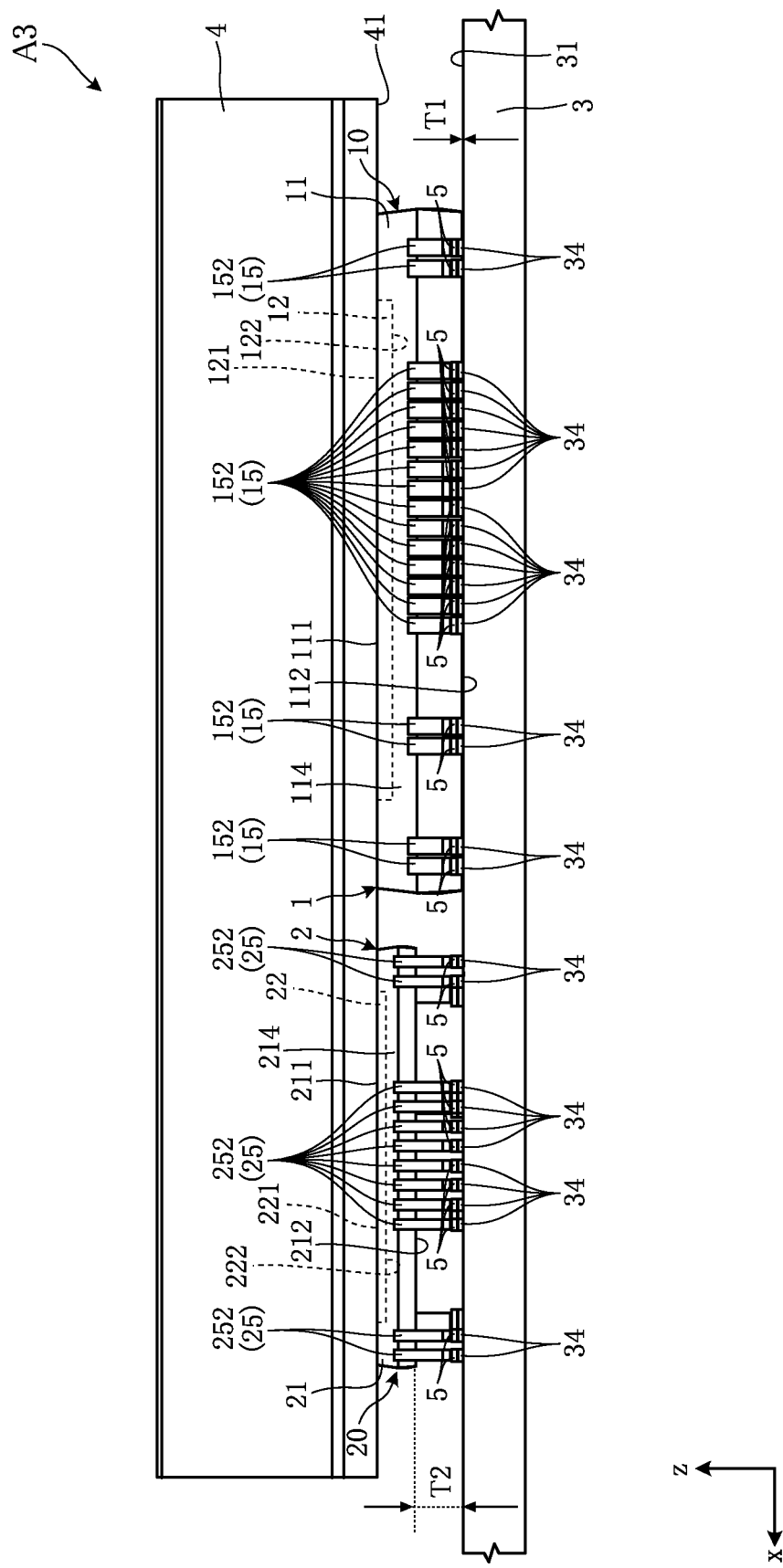
FIG. 13 is a rear view of the electronic device according to the third embodiment.
Figure 14:
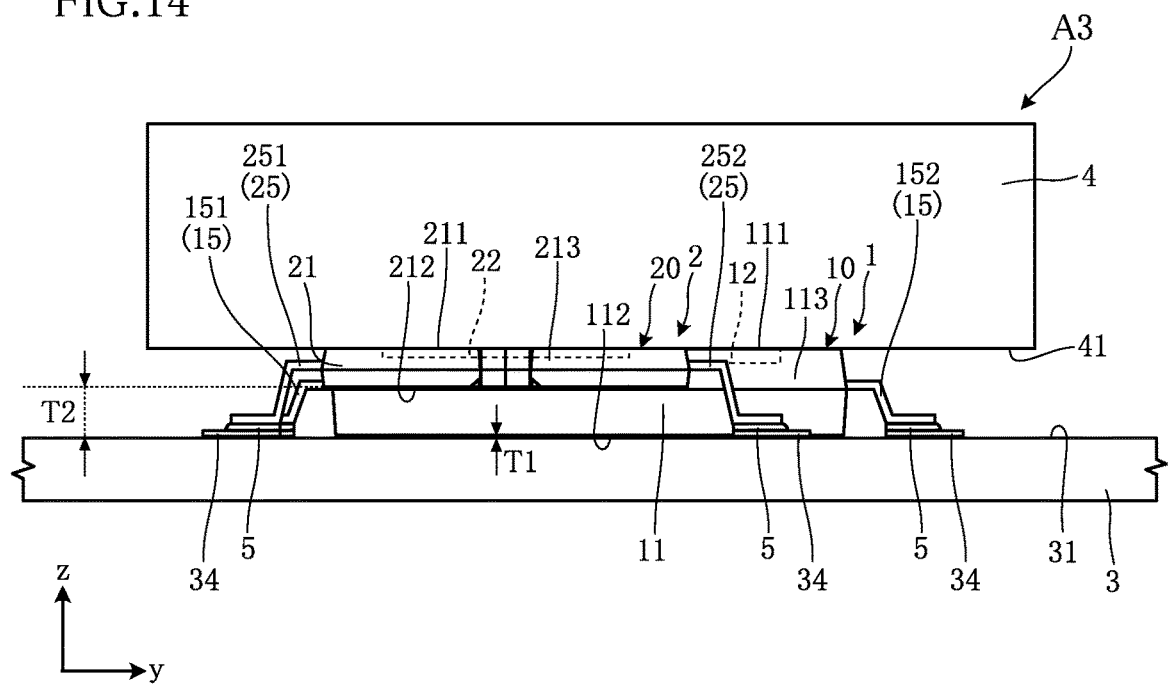
FIG. 14 is a side view (right side view) of the electronic device according to the third embodiment.

FIGS. 11-14 show an electronic device A3 according to a third embodiment. FIG. 11 is a plan view of the electronic device A3. FIG. 12 is a plan view of the electronic device A3. FIG. 13 is a rear view of the electronic device A3. FIG. 14 is a side view (right side view) of the electronic device A3.

As shown in FIGS. 11-14, the electronic device A3 differs from the electronic device A1 in that the first terminals 15 of the first electronic component 1 and the second terminals 25 of the second electronic component 2 are configured as the surface mount type.

In the mounting substrate 3 of the electronic device A3, the interconnect pattern (now shown) includes a plurality of land patterns 34. The land patterns 34 are electrically connected by the interconnect pattern (not shown).

As mentioned above, each of the first terminals 15 and each of the second terminals 25 is configured as the surface mount type. The first terminals 15 and the second terminals 25 are, for example, in the form of a strip as viewed in plan.

As shown in FIG. 14, each of the first terminals 15 is partially bent to include a base portion extending from a side surface 114 along the y direction, an intermediate portion extending downward in the z direction, and an end portion extending along the y direction. The end portion (distal end from each side surface 114) is bonded to a relevant land pattern 34. In the illustrated example, each first terminal 15 and a relevant land pattern 34 are bonded with a conductive bonding material 5 (e.g., solder). In the example shown in FIG. 14, the intermediate portion is inclined with respect to the z direction. However, the intermediate portion may be along the z direction.

As shown in FIG. 14, each of the second terminals 25 is also partially bent to include a base portion extending from a side surface 214 along the y direction, an intermediate portion extending downward in the z direction, and an end portion extending along the y direction. The end portion (distal end from each side surface 214) is bonded to a relevant land pattern 34. In the illustrated example, each second terminal 25 and a relevant land pattern 34 are bonded with a conductive bonding material 5 (e.g., solder). In the example shown in FIG. 14, the intermediate portion is inclined with respect to the z direction. However, the intermediate portion may be along the z direction.

In the electronic device A3, the dimension of each second terminal 25 in the z direction is made larger than the dimension of each first terminal 15 in the z direction. Specifically, the dimension of the intermediate portion of each second terminal 25 in the z direction is made larger than the dimension of the intermediate portion of each first terminal 15 in the z direction. Such an arrangement makes the separation distance T2 between the back surface 212 and the mounting surface 31 in the z direction larger than the separation distance T1 between the back surface 112 and the mounting surface 31 in the z direction, allowing the front surface 111 (first sealing member 11) and the front surface 211 (second sealing member 21) to be positioned within a same x-y plane.

As with the electronic devices A1 and A2, the electronic device A3 includes the heat dissipator 4 attached to the first electronic component 1 and the second electronic component 2. Thus, the electronic device A3 enhances the heat dissipation from the first electronic component 1 and the second electronic component 2. The electronic device A3 also eliminates a step between the first front surface of the first main body 10 (mainly the front surface 111 of the first sealing member 11) and the second front surface of the second main body 20 (mainly the front surface 211 of the second sealing member 21) to allow the attachment of the heat dissipator 4 common to the first electronic component 1 and the second electronic component 2. Thus, the manufacture and maintenance of the device is relatively easy.

Fourth Embodiment

Figure 15:
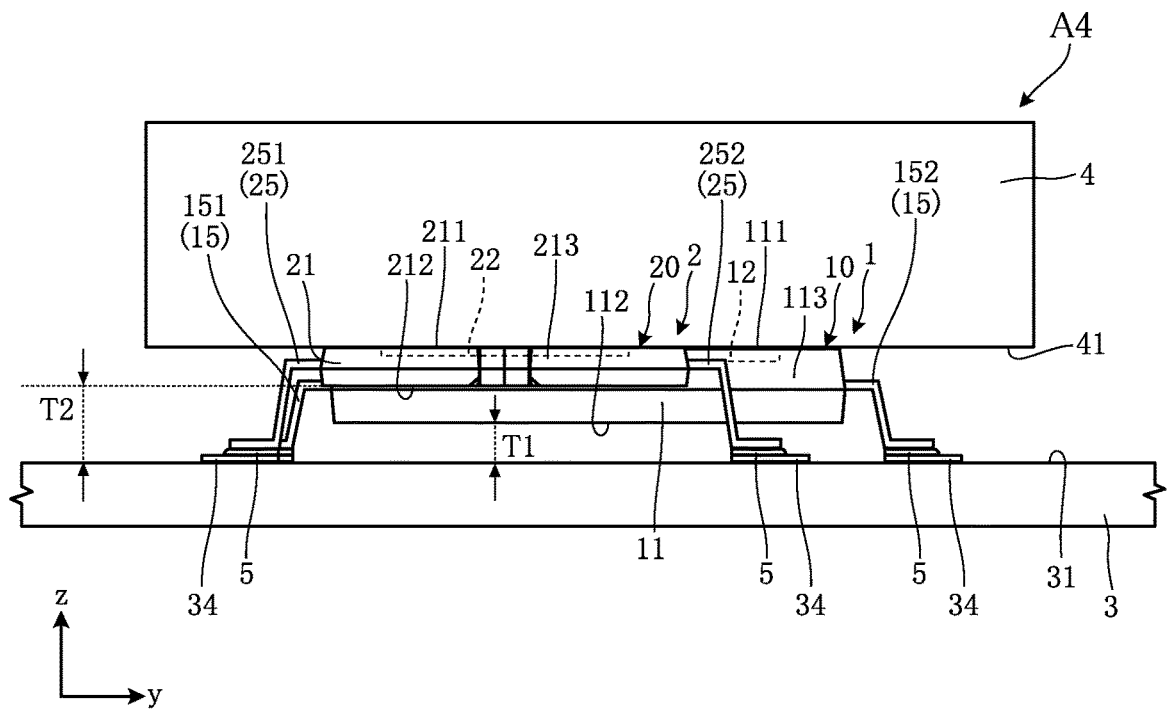
FIG. 15 is a side view (right side view) of an electronic device according to a fourth embodiment.

FIG. 15 shows an electronic device A4 according to a fourth embodiment. FIG. 15 is a side view (right side view) of the electronic device A4.

As shown in FIG. 15, the electronic device A4 differs from the electronic device A3 in that a gap is provided between the first back surface of the first main body 10 (back surface 112 of the first sealing member 11) and the mounting surface 31 (mounting substrate 3).

As with the electronic device A2, the electronic device A4 has a gap between the back surface 112 and the mounting surface 31. That is, in the electronic device A4, the separation distance T1 between the back surface 112 and the mounting surface 31 is made larger than the separation distance T1 in the third embodiment. The separation distance T2 between the back surface 212 and the mounting surface 31 is made larger than the separation distance T2 in the third embodiment by the amount of the increased separation distance T1. In the present embodiment again, the separation distance T2 between the back surface 212 and the mounting surface 31 is larger than the separation distance T1 between the back surface 112 and the mounting surface 31.

As with the electronic devices A1-A3, the electronic device A4 includes the heat dissipator 4 attached to the first electronic component 1 and the second electronic component 2. Thus, the electronic device A4 enhances the heat dissipation from the first electronic component 1 and the second electronic component 2. The electronic device A4 also eliminates a step between the first front surface of the first main body 10 (mainly the front surface 111 of the first sealing member 11) and the second front surface of the second main body 20 (mainly the front surface 211 of the second sealing member 21) to allow the attachment of the heat dissipator 4 common to the first electronic component 1 and the second electronic component 2. Thus, the manufacture and maintenance of the device is relatively easy.

The first and the second embodiments have shown the example in which the first terminals 15 (first electronic component 1) and the second terminals 25 (second electronic component 2) both have the insertion-mount structure, and the third and the fourth embodiments have shown the example in which the first terminals 15 (first electronic component 1) and the second terminals 25 (second electronic component 2) both have the surface-mount structure. However, the present disclosure is not limited to these. For example, either the first terminals 15 or the second terminals 25 may have the insertion-mount structure while the other may have the surface-mount structure.

The first through the fourth embodiments have shown the example in which the number of the first semiconductor elements Q1 incorporated in the first electronic component 1 is larger than the number of the second semiconductor elements Q2 incorporated in the second electronic component 2. However, the present disclosure is not limited to this, and the number of the first semiconductor elements Q1 may be smaller than the number of the second semiconductor elements Q2. Depending on the performance or type of the elements used as the first semiconductor elements Q1 or the second semiconductor elements Q2, the first semiconductor elements Q1 may be larger than the second semiconductor element Q2. In such a case, the dimension of the first sealing member 11 in the z direction may be larger than the dimension of the second sealing member 21 in the z direction even when the number of the first semiconductor elements Q1 is smaller than the number of the second semiconductor elements Q2. Even in such a case, a step between the first front surface of the first main body 10 (mainly front surface 111) and the second front surface of the second main body 20 (mainly the front surface 211) is eliminated by setting the separation distance T2 between the second sealing member 21 (back surface 212) and the mounting substrate 3 (mounting surface 31) in the z direction to be larger than the separation distance T1 between the first sealing member 11 (back surface 112) and the mounting substrate 3 (mounting surface 31) in the z direction, thus making it possible to attach the heat dissipator 4 common to the first electronic component 1 and the second electronic component 2.

The first through the fourth embodiments have shown the example in which the electronic device A1-A4 has two electronic components (first electronic component 1 and second electronic component 2). However, the present disclosure is not limited to these, and the electronic device may include three or more electronic components.

The electronic device according to the present disclosure is not limited to the foregoing embodiments. The specific configuration of each part of the electronic device according to the present disclosure may be varied in many ways. For example, the electronic device according to the present disclosure include the embodiments described in the following clauses:

Clause 1.

An electronic device comprising:
  a first electronic component including a first main body and a plurality of first terminals exposed from the first main body;
  a second electronic component including a second main body and a plurality of second terminals exposed from the second main body;
  a mounting substrate having a mounting surface on which the first electronic component and the second electronic component are disposed; and
  a heat dissipator having an attaching surface to which the first electronic component and the second electronic component are attached, wherein
  the first main body and the second main body are disposed between the mounting substrate and the heat dissipator in a thickness direction and arranged side by side in a first direction orthogonal to the thickness direction, the mounting surface and the attaching surface face each other in the thickness direction, the first main body has a first front surface facing the attaching surface and a first back surface facing the mounting surface, the second main body has a second front surface facing the attaching surface and a second back surface facing the mounting surface, a dimension of the second main body in the thickness direction is smaller than a dimension of the first main body in the thickness direction, the first front surface and the second front surface overlap with each other as viewed in the first direction, and a gap is provided between the second back surface and the mounting surface.

Clause 2.

The electronic device according to clause 1, wherein the first back surface and the mounting surface are in contact with each other.

Clause 3.

The electronic device according to clause 1, wherein a gap is provided between the first back surface and the mounting surface, and a separation distance between the second back surface and the mounting surface in the thickness direction is larger than a separation distance between the first back surface and the mounting surface in the thickness direction.

Clause 4.

The electronic device according to any of clauses 1-3, wherein the mounting substrate is formed with a plurality of land patterns on the mounting surface, and the first terminals and the second terminals are each configured as a partially bent surface-mount type and have respective ends bonded to the land patterns.

Clause 5.

The electronic device according to any of clauses 1-3, wherein the mounting substrate is formed with a plurality of through-holes penetrating the mounting substrate in the thickness direction, and the first terminals and the second terminals are each configured as an insertion-mount type and have respective ends extending in the thickness direction and inserted into the through-holes.

Clause 6.

The electronic device according to clause 5, wherein one or more of the second terminals include a projection located between the second back surface and the mounting surface and projecting in a direction orthogonal to the thickness direction.

Clause 7.

The electronic device according to any of clauses 1-6, wherein the first front surface and the second front surface are bonded to the attaching surface of the heat dissipator with an adhesive.

Clause 8.

The electronic device according to any of clauses 1-7, wherein the first main body includes a plurality of first semiconductor elements and a first sealing member covering the first semiconductor elements, and the plurality of first terminals include a first power terminal electrically connected to the first semiconductor elements.

Clause 9.

The electronic device according to clause 8, wherein the first main body further includes a first control element that controls driving of each of the first semiconductor elements, the first control element being covered with the first sealing member, and the plurality of first terminals include a first control terminal electrically connected to the first control element.

Clause 10.

The electronic device according to clause 9, wherein the first electronic component is a power module.

Clause 11.

The electronic device according to any of clauses 8-10, wherein the first main body further includes a first support substrate supporting at least the first semiconductor elements, and the first support substrate has a first support surface which faces the mounting surface and on which the first semiconductor elements are mounted.

Clause 12.

The electronic device according to clause 11, wherein the first sealing member has a first sealing surface facing the attaching surface, the first support substrate further includes a first exposed surface facing the attaching surface and exposed from the first sealing surface, and the first sealing surface and the first exposed surface are flush with each other and constitute the first front surface.

Clause 13.

The electronic device according to any of clauses 8-12, wherein the second main body includes one or more second semiconductor elements that are less than the first semiconductor elements and a second sealing member covering the second semiconductor elements, and the second terminals include a second power terminal electrically connected to said one or more second semiconductor elements.

Clause 14.

The electronic device according to clause 13, wherein the second main body further includes a second control element that controls driving of each of said one or more second semiconductor elements, the second control element is covered with the second sealing member, and the plurality of second terminals include a second control terminal electrically connected to the second control element.

Clause 15.

The electronic device according to clause 14, wherein the second electronic component is a power module.

Clause 16.

The electronic device according to any of clauses 13-15, wherein the second main body further includes a second support substrate supporting said one or more second semiconductor elements, and the second support substrate has a second support surface which faces the mounting surface and on which said one or more second semiconductor elements are mounted.

Clause 17.

The electronic device according to clause 16, wherein the second sealing member has a second sealing surface facing the attaching surface, the second support substrate further includes a second exposed surface facing the attaching surface and exposed from the second sealing surface, and the second sealing surface and the second exposed surface are flush with each other and constitute the second front surface.

LIST OF REFERENCE CHARACTERS

A1-A4: Electronic device
1: First electronic component
M1: First control element
Q1: First semiconductor element
T11, T12: First terminal
T11a, T11b: Input terminal
T11c: Output terminal
T11d: Detection terminal
10: First main body
11: First sealing member
111: Front surface
112: Back surface
113, 114: Side surface
12: First support substrate
121: First exposed surface
122: First support surface
15: First terminal
151: First power terminal
152: First control terminal
153: First projection
2: Second electronic component
M2: Second control element
Q2: Second semiconductor element
T21, T22: Second terminal
T21a, T21b: Input terminal
T21c: Output terminal
T21d: Detection terminal
20: Second main body
21: Second sealing member
22: Second support substrate
25: Second terminal
211: Front surface
212: Back surface
213: Side surface
214: Side surface
221: Second exposed surface
222: Second support surface
251: Second power terminal
252: Second control terminal
253: Second projection
3: Mounting substrate
31: Mounting surface
33: Through-hole
34: Land pattern
4: Heat dissipator
41: Attaching surface
5: Conductive bonding material

The invention claimed is:

1. An electronic device comprising:
a first electronic component including a first main body and a plurality of first terminals exposed from the first main body;
a second electronic component including a second main body and a plurality of second terminals exposed from the second main body;
a mounting substrate having a mounting surface on which the first electronic component and the second electronic component are disposed; and
a heat dissipator having an attaching surface to which the first electronic component and the second electronic component are attached, wherein the first main body and the second main body are disposed between the mounting substrate and the heat dissipator in a thickness direction and arranged side by side in a first direction orthogonal to the thickness direction,
the mounting surface and the attaching surface face each other in the thickness direction,
the first main body has a first front surface facing the attaching surface and a first back surface facing the mounting surface,
the second main body has a second front surface facing the attaching surface and a second back surface facing the mounting surface,
a dimension of the second main body in the thickness direction is smaller than a dimension of the first main body in the thickness direction,
the first front surface and the second front surface overlap with each other as viewed in the first direction,
a gap is provided between the second back surface and the mounting surface,
the first main body includes a plurality of first semiconductor elements and a first sealing member covering the first semiconductor elements,
the plurality of first terminals include a first power terminal electrically connected to the first semiconductor elements,
the second main body includes one or more second semiconductor elements and a second sealing member covering the second semiconductor elements, with a number of the second semiconductor elements being less than a number of the first semiconductor elements and the first sealing member being separate from the second sealing member, and
the second terminals include a second power terminal electrically connected to said one or more second semiconductor elements.

2. The electronic device according to claim 1, wherein the first back surface and the mounting surface are in contact with each other.

3. The electronic device according to claim 1, wherein a gap is provided between the first back surface and the mounting surface, and
a separation distance between the second back surface and the mounting surface in the thickness direction is larger than a separation distance between the first back surface and the mounting surface in the thickness direction.

4. The electronic device according to claim 1, wherein the mounting substrate is formed with a plurality of land patterns on the mounting surface, and
the first terminals and the second terminals are each configured as a partially bent surface-mount type and have respective ends bonded to the land patterns.

5. The electronic device according to claim 1, wherein the mounting substrate is formed with a plurality of through-holes penetrating the mounting substrate in the thickness direction, and
the first terminals and the second terminals are each configured as an insertion-mount type and have respective ends extending in the thickness direction and inserted into the through-holes.

6. The electronic device according to claim 5, wherein one or more of the first terminals include a first projection located between the first back surface and the mounting surface and projecting in a direction orthogonal to the thickness direction,
one or more of the second terminals include a second projection located between the second back surface and the mounting surface and projecting in a direction orthogonal to the thickness direction, and a distance between the first projection and the first back surface in the thickness direction is smaller than a distance between the second projection and the second back surface in the thickness direction.

7. The electronic device according to claim 1, wherein the first front surface and the second front surface are bonded to the attaching surface of the heat dissipator with an adhesive.

8. The electronic device according to claim 1, wherein the first main body further includes a first control element that controls driving of each of the first semiconductor elements, the first control element being covered with the first sealing member, and the plurality of first terminals include a first control terminal electrically connected to the first control element.

9. The electronic device according to claim 8, wherein the first electronic component is a power module.

10. The electronic device according to claim 1, wherein the first main body further includes a first support substrate supporting at least the first semiconductor elements, and the first support substrate has a first support surface which faces the mounting surface and on which the first semiconductor elements are mounted.

11. The electronic device according to claim 10, wherein the first sealing member has a first sealing surface facing the attaching surface, the first support substrate further includes a first exposed surface facing the attaching surface and exposed from the first sealing surface, and the first sealing surface and the first exposed surface are flush with each other and constitute the first front surface.

12. The electronic device according to claim 1, wherein the second main body further includes a second control element that controls driving of each of said one or more second semiconductor elements, the second control element is covered with the second sealing member, and the plurality of second terminals include a second control terminal electrically connected to the second control element.

13. The electronic device according to claim 12, wherein the second electronic component is a power module.

14. The electronic device according to claim 1, wherein the second main body further includes a second support substrate supporting said one or more second semiconductor elements, and the second support substrate has a second support surface which faces the mounting surface and on which said one or more second semiconductor elements are mounted.

15. The electronic device according to claim 14, wherein the second sealing member has a second sealing surface facing the attaching surface, the second support substrate further includes a second exposed surface facing the attaching surface and exposed from the second sealing surface, and the second sealing surface and the second exposed surface are flush with each other and constitute the second front surface.

* * * * *